(12) United States Patent
Asano et al.

(10) Patent No.: US 6,866,976 B2
(45) Date of Patent: Mar. 15, 2005

(54) MONITORING METHOD, EXPOSURE METHOD, A MANUFACTURING METHOD FOR A SEMICONDUCTOR DEVICE, INCLUDING AN ETCHING METHOD AND EXPOSURE PROCESSING UNIT

(75) Inventors: Masafumi Asano, Kanagawa (JP); Nobuhiro Komine, Kanagawa (JP); Soichi Inoue, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 10/394,047

(22) Filed: Mar. 24, 2003

(65) Prior Publication Data

US 2003/0215724 A1 Nov. 20, 2003

(30) Foreign Application Priority Data

Mar. 26, 2002 (JP) .................................... P2002-087015

(51) Int. Cl.⁷ ................................................ G03F 9/00
(52) U.S. Cl. ........................... 430/30; 430/22; 430/313; 355/27; 355/55; 355/67; 356/399
(58) Field of Search ............................ 430/22, 30, 313; 355/27, 55, 67; 356/399

(56) References Cited

U.S. PATENT DOCUMENTS 6,376,139 B1    4/2002    Fujisawa et al. .............. 430/30

FOREIGN PATENT DOCUMENTS

| JP | 10-270320 | 10/1998 |
|---|---|---|
| JP | 3052064 | 4/2000 |
| JP | 2000-310850 | 11/2000 |
| JP | 2003-173948 | 6/2003 |

OTHER PUBLICATIONS

Masafumi Asano et al., "CD Control with Effective Exposure Dose Monitor Techinque in Photolithography", Proc. SPIE vol. 4691, pp. 280–287, Mar. 5–8, 2002.

Starikov, "Exposure Monitor Structure," SPIE (1990), 1261:315–324.

*Primary Examiner*—Christopher G. Young
(74) *Attorney, Agent, or Firm*—Finngan, Henderson, Farabow, Garrett & Dunner, L.L.P.

(57) ABSTRACT

A monitoring method, includes: delineating a monitor resist pattern on an underlying film, the monitor resist pattern having a tilted sidewall slanted to a surface of the underlying film at least at one edge of the monitor resist pattern; measuring a width of the monitor resist pattern in an orthogonal direction to a cross line of the tilted sidewall intersecting with the underlying film; delineating a monitor underlying film pattern by selectively etching the underlying film using the monitor resist pattern as a mask; measuring a width of the monitor underlying film pattern in the orthogonal direction; and obtaining a shift width in the monitor underlying film pattern from a difference between the width of the monitor resist pattern and the width of the monitor underlying film pattern.

36 Claims, 29 Drawing Sheets

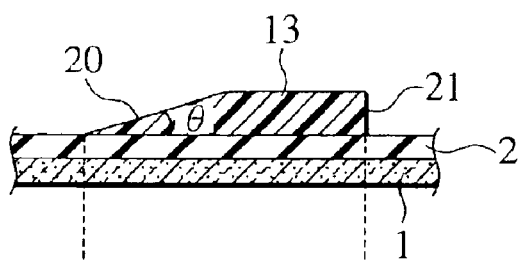
FIG.1A
FIG.1B
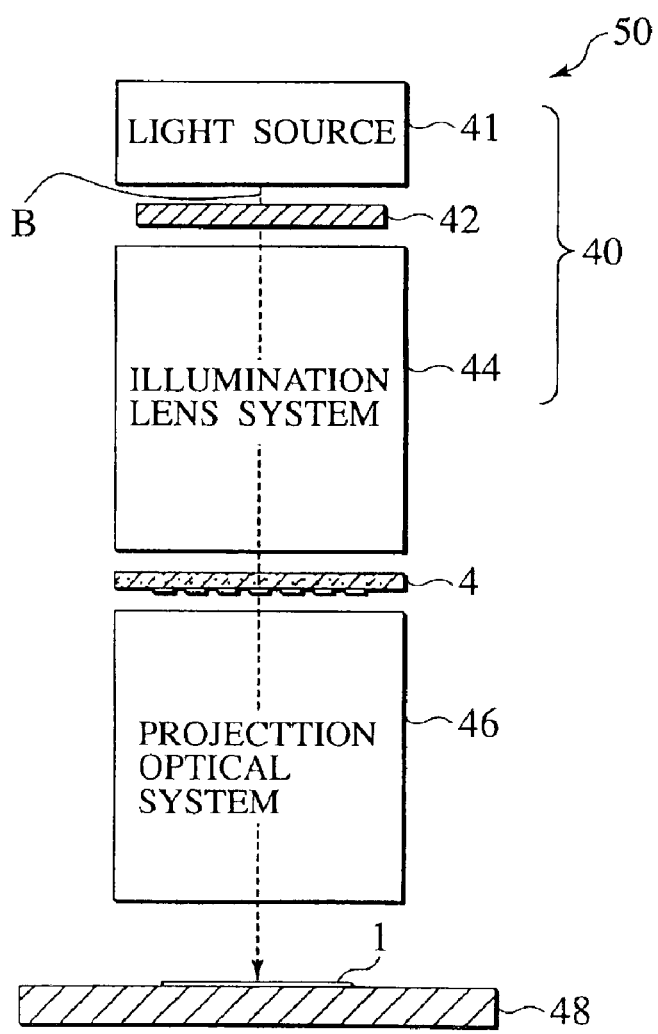
FIG.2

FIG.21
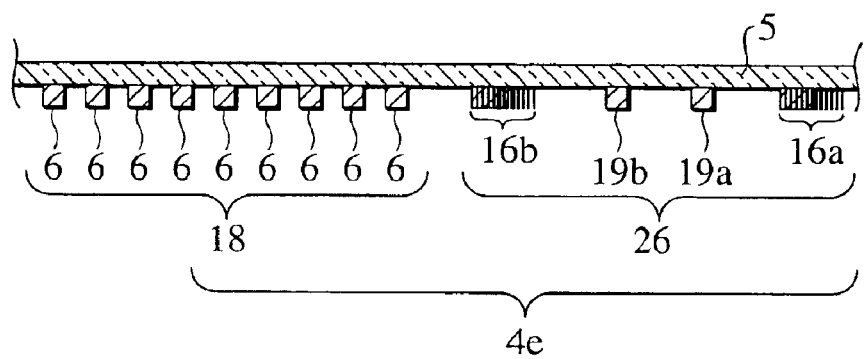
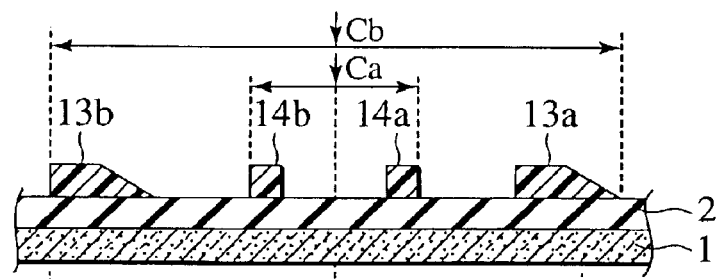
FIG.22A
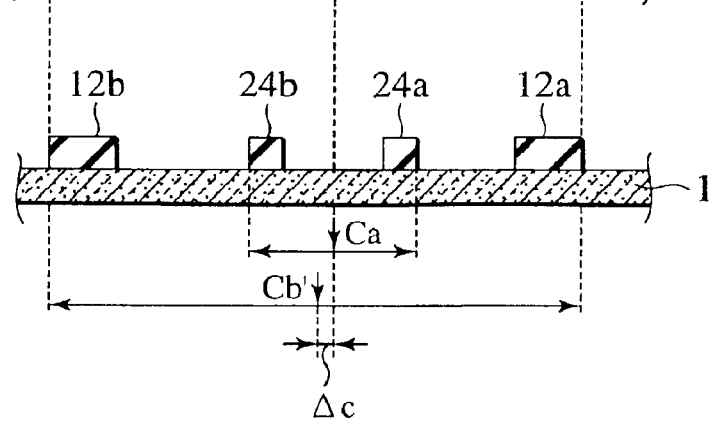
FIG.22B

EFFECTIVE EXPOSURE DOSE
DIFFERENCE (mJ/cm$^2$)

- ▧ -0.25--0.10
- ▨ -0.40--0.25
- ▨ -0.55--0.40
- ▨ -0.70--0.55
- ▨ -0.85--0.70
- ▢ -1.00--0.85

MONITORING METHOD, EXPOSURE METHOD, A MANUFACTURING METHOD FOR A SEMICONDUCTOR DEVICE, INCLUDING AN ETCHING METHOD AND EXPOSURE PROCESSING UNIT

CROSS REFERENCE TO RELATED APPLICATIONS

This application is based upon and claims the benefit of priority from prior Japanese Patent Application P2002-087015 filed on Mar. 26, 2002; the entire contents of which are incorporated by reference herein.

BACKGROUND OF THE INVENTION

1. Field of the Invention

The present invention relates to a method for monitoring a width of a fine pattern with a high degree of accuracy and further relates to an exposure method, an etching method, a manufacturing method for a semiconductor device and an exposure processing unit, all of which use the monitoring method.

2. Description of the Related Art

A semiconductor device performance is mostly controlled by a dimensional precision of a fine pattern. In microfabrication, by using a resist pattern formed by photolithography as a mask, an underlying film such as an insulating film, a conductive film or the like is subjected to a dry etching processing. In manufacturing of a semiconductor device, improvement of dimensional precision in processing in a semiconductor substrate surface is a significant issue. It is thus required to control, with a higher degree of accuracy, parameters for improving the dimensional precision in the processing of the semiconductor substrate by photolithography and dry etching.

In a photolithography process, a semiconductor device pattern is transferred to a resist film serving as a photosensitive agent, coated on a semiconductor substrate, by using an aligner, for example, a reduction projection aligner (stepper). To be more specific, light emitted from a light source is transmitted through a reticle, on which a semiconductor device pattern to be transferred is delineated, and then is reduced by an optical system. In this way, the light is projected onto the semiconductor substrate, so as to form a resist pattern. In the pattern formation by using the stepper, a resolution of the stepper is proportional to an exposure light wavelength λ and is inversely proportional to a numerical aperture NA, based on optical theory. Therefore, because of the demand for miniaturization of semiconductor device, process improvement associated therewith has been heretofore conducted, including shortening of the exposure light wavelength and achieving a higher NA of a projection lens. However, along with the recent demands for further miniaturization of the semiconductor device, it has become extremely difficult to ensure an exposure tolerance and a depth of focus. The depth of focus is proportional to the exposure light wavelength λ and is inversely proportional to the square of the numerical aperture NA. Thus, in order to make measurable improvements in the dimensional precision in processing by effectively utilizing a small exposure margin without causing a reduction in yield, i.e., the amount of production, an exposure dose and focus control with a higher degree of accuracy is required.

For example, when a semiconductor device image is projected repeatedly step by step on a fraction of a semiconductor substrate with the same exposure dose so as to delineate a number of semiconductor device patterns on the semiconductor substrate, the exposure condition varies in the semiconductor substrate surface because of the warpage of the semiconductor substrate, a film thickness distribution of the resist film on the semiconductor substrate surface, and an unevenness in the semiconductor substrate surface relating a post-exposure bake (PEB) and development or the like. Thus, a reduction in the production yield occurs.

Proposals have been made for an exposure monitoring method with attention on exposure control, in "A. Starikov, "Exposure monitor structure", SPIE Vol. 1261 Integrated Circuit Metrology, Inspection, and Process Control 4 (1990)" and in Japanese Patent Laid-Open No. 2000-310850. The proposals have their own common characteristics in that, in a stepper, an image is transferred with a inclined exposure distribution by using a reticle having a pattern therein with a dimensional ratio (a duty ratio) of a transparent portion and an opaque portion continuously changed in one direction by a pitch that can not resolve images on the semiconductor substrate. By use of this method, a variation distribution of an effective optimum exposure dose in resist mask pattern formation can be provided.

Moreover, in Japanese Patent Laid-Open No. Hei 10(1998)-270320, an exposure method is proposed, in which, in order to reduce a variation of the dimensional precision in a pattern on a semiconductor substrate after a photolithography process, the semiconductor substrate is divided into several areas and an exposure dose is set for each of the areas. However, it seems that this method may not be an effective correction method because an approximation accuracy of a exposure dose is not so high.

A dry etching process is performed following the photolithography process. In the dry etching process, an underlying film on the semiconductor substrate is subjected to etching by using a resist pattern formed in the photolithography process as a selective etching mask and by bombarding ions generated in a gas plasma. The dimensional precision of the dry etching is not only influenced by etching conditions such as substrate temperature, plasma density, self-bias voltage and the like but also by the shape of the selective etching mask made of the resist pattern. Therefore, the respective influences of the dry etching and the photolithography cannot be separated from each other so as to be measured. Thus, direct monitoring of the exposure dose thereof may be impossible.

Moreover, in order to provide a microfabrication control with a high degree of accuracy, at the same time, a width monitoring technology of a fine pattern is also important. For the width monitoring of the fine pattern, a scanning electron microscope (SEM) has been heretofore used. However, measurement by the SEM has problems; (a) a sufficient measurement accuracy cannot be provided because pattern miniaturization has taken the SEM measurement approach to its limit; and (b) an electron beam irradiation is likely to damage the resist film, the underlying film or the semiconductor substrate.

As described above, in the microfabrication, in order to obtain a processing precision and evenness of a pattern dimension of the semiconductor device, it is important to control, with high accuracy, the exposure conditions of the photolithography, the etching conditions of the dry etching and the like. However, there is a problem in the method for measuring with easily high accuracy the fine pattern without damaging the semiconductor substrate. Moreover, it is difficult to separate the influences of the respective processes of the photolithography and the dry etching in the microfabrication for measurement with high accuracy. Thus, processing control of the semiconductor device cannot be effectively achieved.

SUMMARY OF THE INVENTION

A first aspect of the present invention inheres in a monitoring method, and includes: delineating a monitor resist pattern on an underlying film, the monitor resist pattern having a tilted sidewall slanted to a surface of the underlying film at least at one edge of the monitor resist pattern; measuring a width of the monitor resist pattern in an orthogonal direction to a cross line of the tilted sidewall intersecting with the underlying film; delineating a monitor underlying film pattern by selectively etching the underlying film using the monitor resist pattern as a mask; measuring a width of the monitor underlying film pattern in the orthogonal direction; and obtaining a shift width in the monitor underlying film pattern from a difference between the width of the monitor resist pattern and the width of the monitor underlying film pattern.

A second aspect of the present invention inheres in an exposure method, and includes: assigning a plurality of exposure fields on a surface of a semiconductor substrate; and setting exposure doses for the exposure fields by approximation using an exposure dose function defined on positional coordinates of the semiconductor substrate.

A third aspect of the present invention inheres in a manufacturing method of a semiconductor device, and includes: performing a manufacturing process for fabricating the semiconductor device on a semiconductor substrate; setting exposure doses for a plurality of exposure fields by approximation using an exposure dose function of positional coordinates defined on the semiconductor substrate for each of the exposure fields, the plurality of exposure fields are assigned on a surface of the semiconductor substrate; depositing an underlying film on the semiconductor substrate; delineating a monitor resist pattern having a tilted sidewall slanted to a surface of the underlying film; delineating a monitor underlying film pattern by selectively etching the underlying film using the monitor resist pattern as a mask; measuring a shift width distribution of shift widths of the monitor underlying film pattern each of the exposure fields; comparing a variation in the shift width distribution to a permissible limit value; and when the variation is smaller than the permissible limit value, performing a second manufacturing process while maintaining the exposure doses of the exposure fields, and when the variation exceeds the permissible limit value, performing the second manufacturing process by approximating the shift width distribution by use of a polynomial equation of positional coordinates defined on the semiconductor substrate and calculating another exposure doses for the exposure fields.

A fourth aspect of the present invention inheres in an etching method, and includes: setting exposure doses for a plurality of exposure fields assigned on a surface of an underlying layer, the underlying film deposited on a semiconductor substrate; delineating a monitor resist pattern having a tilted sidewall slanted to a surface of the underlying film; measuring a shift width of the monitor resist pattern for each of the exposure fields; delineating a monitor underlying film pattern by selectively etching the underlying film by an etching condition using the monitor resist pattern as a mask; measuring a shift width of the monitor underlying film pattern for each of the exposure fields; obtaining a shift width difference distribution by taking a difference between the shift width of the monitor underlying film pattern and the shift width of the monitor resist pattern; comparing a variation in the shift width difference distribution to a permissible limit value; and when the variation is smaller than the permissible limit value, maintaining the etching condition, and when the variation exceeds the permissible limit value, setting another etching condition repeating a processing to compare another variation in another shift width difference distribution to the permissible limit value by adjusting the etching condition.

A fifth aspect of the present invention inheres in a manufacturing method of a semiconductor device, and includes: performing a manufacturing process for fabricating the semiconductor device on a semiconductor substrate; setting exposure doses for a plurality of exposure fields assigned on a surface of the semiconductor substrate; depositing an underlying film on the semiconductor substrate; coating a resist film on the underlying film; delineating a monitor resist pattern having a tilted sidewall slanted to a surface of the underlying film; measuring a shift width of the monitor resist pattern for each of the exposure fields; delineating a monitor underlying film pattern by selectively etching the underlying film by an etching condition using the monitor resist pattern as a mask; measuring a shift width of the monitor underlying film pattern for each of the exposure fields; obtaining a shift width difference distribution by taking a difference between the shift width of the monitor underlying film pattern and the shift width of the monitor resist pattern; comparing a variation in the shift width difference distribution to a permissible limit value; and when the variation is smaller than the permissible limit value, performing a second manufacturing process by maintaining the etching condition, and when the variation exceeds the permissible limit value, performing the second manufacturing process by setting another etching condition repeating a processing to compare another variation in another shift width difference distribution to the permissible limit value by adjusting the etching condition.

A sixth aspect of the present invention inheres in an exposure processing unit, comprising: a data input module configured to acquire shift widths of patterns for each of a plurality of exposure fields assigned on a surface of a semiconductor substrate, the patterns being delineated on the semiconductor substrate by use of an aligner performing a sequential exposure to the exposure fields; an exposure calculation module configured to convert the shift widths into effective exposure doses by use of a relational expression; a correction coefficient calculation module configured to calculate correction coefficients by an approximation of a distribution of the effective exposure doses for each of the exposure fields by use of an exposure dose function of positional coordinates defined on the semiconductor substrate; and a data output module configured to output corrected exposure doses being corrected by the correction coefficients of the exposure fields to an aligner control unit.

BRIEF DESCRIPTION OF DRAWINGS

FIGS. 1A and 1B are cross-sectional views showing an example of a semiconductor substrate used in a monitoring method according to a first embodiment of the present invention;

FIG. 2 is a schematic constitutional view of an aligner used in the monitoring method according to the first embodiment of the present invention;

FIG. 4A is a cross-sectional view of a reticle; FIG. 4B, a graph showing a transmission property of an exposure light; and FIG. 4C, a cross-sectional view of a resist pattern to be formed;

FIG. 9A is a cross-sectional view of a reticle; FIG. 9B, a graph showing a transmission property of an exposure light; and FIG. 9C, a cross-sectional view of a monitor resist pattern to be formed;

FIG. 21 is a cross-sectional view showing an example of a reticle used in the monitoring method according to the second embodiment of the present invention;

FIGS. 22A and 22B are cross-sectional views showing an example of a monitor resist pattern and a monitor underlying film pattern, obtained in the steps for explaining the monitoring method according to the second embodiment of the present invention;

DETAILED DESCRIPTION OF THE INVENTION

Figure 3:
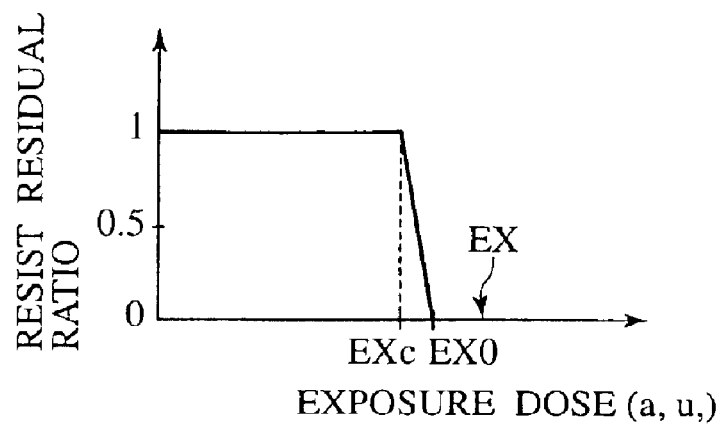
FIG. 3 is a graph showing a residual characteristic of a resist regarding to an exposure dose, for explaining the monitoring method according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

In a monitoring method according to a first embodiment of the present invention, as shown in FIG. 1A, a monitor resist pattern 13 is formed on a surface of an underlying film 2 such as a silicon oxide ($SiO_2$) film or the like deposited on a semiconductor substrate 1. Specifically, the monitor resist pattern 13 has a tilted sidewall 20 slanted at a tilt angle $\theta$ to the surface of the underlying film and a steep-angle sidewall 21 formed approximately perpendicular to the surface thereof. After dry etching the underlying film 2 by using the monitor resist pattern 13 as a mask, the monitor resist pattern 13 is removed. Then, a shift width $\Delta s$ of a monitor underlying film pattern 12, shown in FIG. 1B, is measured.

A shape of the sidewall of the monitor resist pattern 13 affects a finished width of the pattern in the case of an anisotropic dry etching such as, for example, a reactive ion etching (RIE). Specifically, in a process of the RIE where the processing is carried out in a direction perpendicular to the surface of the semiconductor substrate 1, the tilted sidewall 20 of the monitor resist pattern 13 is etched by bombardment of ions. On the contrary, the steep-angle sidewall 21 is not etched because only a few ions are irradiated. In the tilted sidewall 20, during the RIE, an edge position of the monitor resist pattern 13 is shifted. In general, the shift width $\Delta s$ depends on the degree of the tilt angle $\theta$ of the tilted sidewall 20, and the smaller tilt angle provides the larger shift width $\Delta s$. In the steep-angle sidewall 21 approximately perpendicular to the surface of the underlying film, the edge position thereof hardly shifts at all. Therefore, the shift width $\Delta s$ at the edge position shows with emphasis of an influence to a patterning dimension in the RIE processing. Thus, the shift width $\Delta s$ can be applied for evaluation of accuracy in the RIE processing. Moreover, by using a distribution of the shift width $\Delta s$ in the semiconductor substrate 1, the evenness in the RIE processing can be measured.

An aligner 50 executing a photolithography process of the first embodiment of the present invention is a stepper as shown in FIG. 2. A reduction ratio thereof is assumed to be 1:5. An illumination optical system 40 includes a light source 41, a shutter 42 and an illumination lens system 44. As the light source 41, a krypton fluoride (KrF) excimer laser is used which has a wavelength $\lambda$ of 248 nm. The illumination lens system 44 includes a fly's eye lens and a condenser lens. A coherence factor $\sigma$ of the illumination optical system is 0.75. A projection optical system 46 includes a projection lens, a lens aperture and the like, in which a lens numerical aperture NA is 0.6. A reticle 4 is provided between the illumination optical system 40 and the projection optical system 46. A pattern of the reticle 4 being illuminated by an exposure light B, is reduced and projected on the semiconductor substrate 1 on a stage 48. An exposure field per exposure is 20 mm square. It should be noted that, as a matter of explanatory convenience, the reduction ratio of the aligner 50 is set to be 1:5. However, it is needless to say that the ratio may be any reduction ratio. In the description below, the dimension of the pattern on the reticle 4 will be described in terms of a dimension reduced and projected on the semiconductor substrate 1 unless otherwise noted.

A resist used in the first embodiment of the present invention as shown in FIG. 3 is sensitive to the exposure light over an exposure dose EXc determined by a sensitivity curve of the resist. A resist film exposed with the exposure dose of EXc or more is dissolved in a development process, and thus a film thickness thereof is reduced. The resist film is completely dissolved when exposed with the exposure dose of EX0 or more, where the exposure dose EX0 depends on a resist film thickness and the sensitivity of the resist film. Usually, an exposure dose EX for exposing the reticle 4, which is larger than the exposure dose EX0, is applied thereto so as to ensure removal of the resist film. The region between the exposure dose EXc and EX0 is an intermediate region, and the resist film is reduced therebetween but remains on the substrate surface.

Figure 4A:
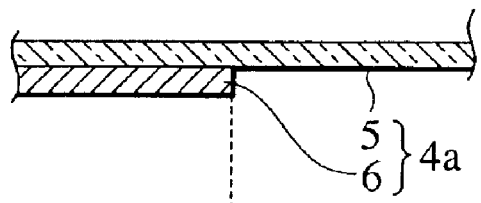
FIGS. 4A through 4C are an example for explaining the monitoring method according to the first embodiment of the present invention.
Figure 4B:
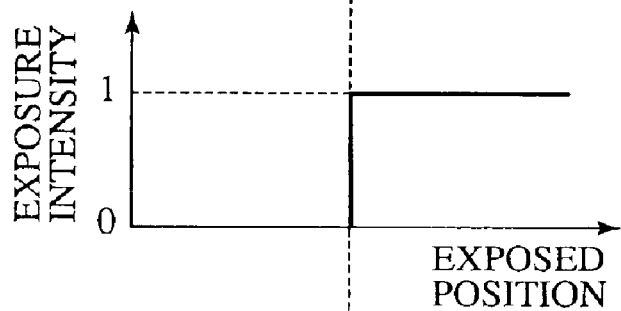
Figure 4C:
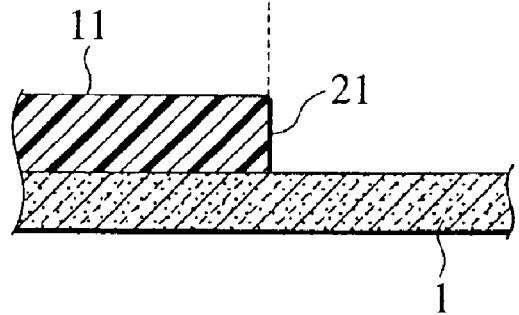

In a reticle 4a shown in FIG. 4A, an opaque film 6 shielding the exposure light is provided in a part of a transparent substrate 5 such as a quartz substrate and the like. In general, as the opaque film 6, a metal film such as chromium (Cr) and the like is used. However, as long as the film has a strong enough light shielding characteristics to the exposure light, other materials, for example, an alloyed metal, a metal oxide, an organic material or the like may be used. When the semiconductor substrate 1 having the resist film applied thereon is exposed to the exposure dose EX by use of the reticle 4a, as shown in FIG. 4B, an optical image is obtained corresponding to the opaque film 6 of the reticle 4a. Specifically, the exposure dose rapidly changes from 0 to EX at an exposed position corresponding to an edge of the opaque film 6 of the reticle 4a. Herein, an exposure light transmissivity of the opaque film 6 of the reticle 4a is 0%, and the exposure light transmissivity of a transparent portion where only the transparent substrate 5 exists is 100%. The optical image is transferred to the resist film in accordance with the sensitivity curve of the resist, and thus a resist pattern 11 is formed as shown in FIG. 4C. An edge of the resist pattern 11 formed on the semiconductor substrate 1 is approximately vertical, and provides the steep-angle sidewall 21 in accordance with an exposure intensity shown in FIG. 4B.

Figure 5:
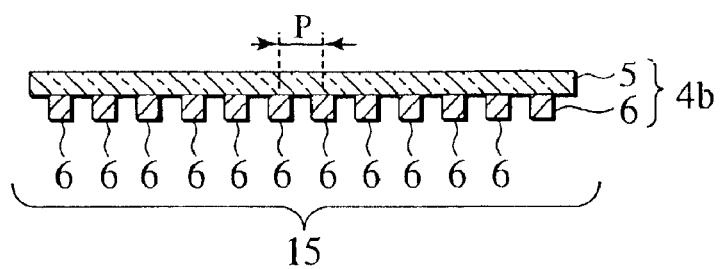
FIG. 5 is a cross-sectional view showing an example of a reticle used for explaining the monitoring method according to the first embodiment of the present invention.

In a reticle 4b, as shown in FIG. 5, an exposure test pattern 15 is provided on a transparent substrate 5 so as to have a diffraction grating. A pitch P of thin opaque films 6 in the diffraction grating satisfies the following condition.

$$P<\lambda/NA*(1+\sigma) \qquad (1)$$

Figure 6:
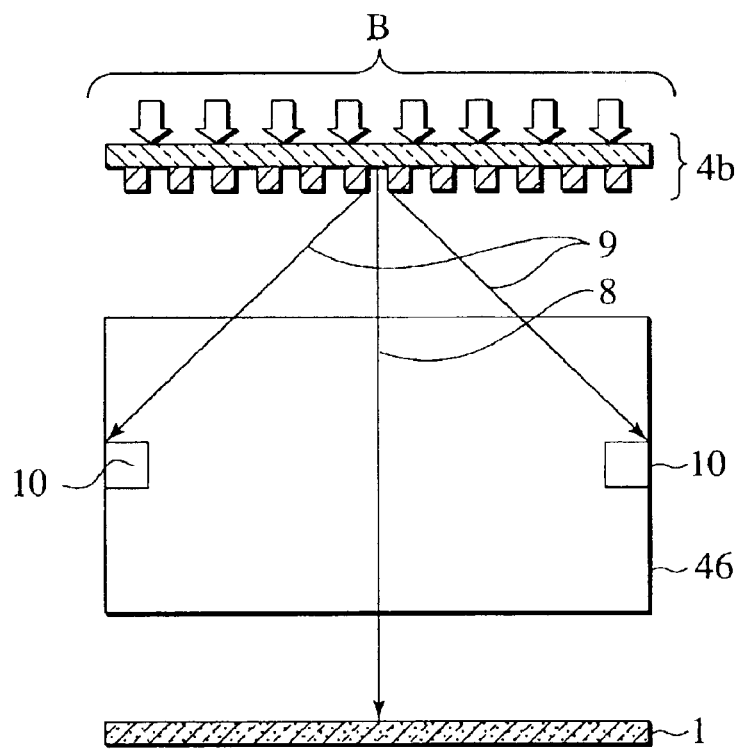
FIG. 6 is a view showing an example of an exposure method for explaining the monitoring method according to the first embodiment of the present invention.

Note that the dimension of the pitch P is described in terms of a reduced and projected dimension, as described above, and the dimension of the pitch P on the reticle 4b is five times larger than the reduced dimension. When the pitch P satisfies the condition of the inequality (1), the pattern projected by the reticle 4b is not resolved on the substrate. When the aligner 50 ($\lambda$: 248 nm, NA: 0.6, $\sigma$: 0.75) of the first embodiment of the present invention is used, the pitch P satisfying the condition of the inequality (1) is approximately 234 nm or less. As shown in FIG. 6, an exposure light B with the exposure intensity EX is diffracted by the exposure test pattern 15 of the reticle 4b. However, a first-order diffracted light 9 is shielded by a lens aperture 10 of the projection optical system 46 of the aligner 50 and never reaches the surface of the semiconductor substrate. In other words, on the surface of the semiconductor substrate, only a uniform distribution of a zero-order diffracted light 8 is generated and no image of the diffraction grating pattern of the exposure test pattern 15 is formed.

Figure 7:
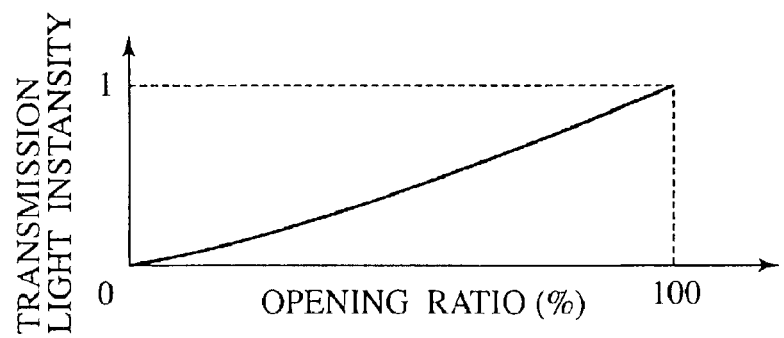
FIG. 7 is a graph showing an example of a transmission property of an exposure light of a reticle regarding to a numerical aperture for explaining the monitoring method according to the first embodiment of the present invention.

FIG. 7 shows a measured result obtained when an intensity of the zero-order diffracted light 8 of the exposure light transmitted onto the semiconductor substrate 1 using the reticle 4b having the pitch P satisfying the condition of the inequality (1) and different opening ratios of the diffraction grating of the exposure test pattern 15. Herein, the transmission light intensity is expressed by using a proportion thereof to the incident exposure dose EX. When the opening ratio of the diffraction grating is increased from 0 to 100%, the transmission light intensity is accordingly increased from 0 to 1 as shown in FIG. 7. From this result, when providing a pattern having the opening ratio of the diffraction grating proportionally varied, an exposure pattern with a distribution of an exposure light transmissivity can be effectively formed.

Figure 8A:
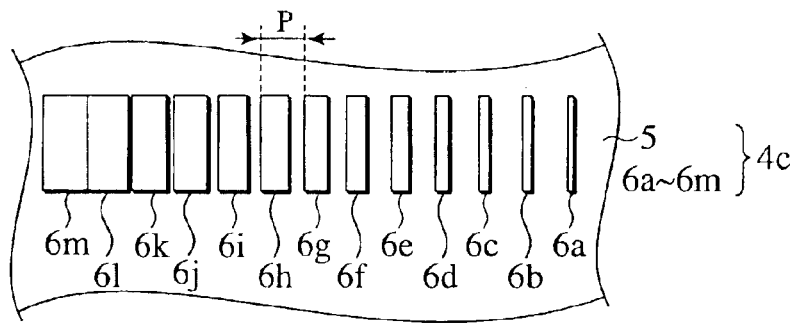
FIGS. 8A and 8B are a plan view and a cross-sectional view, showing an example of the reticle used in the monitoring method according to the first embodiment of the present invention.
Figure 8B:
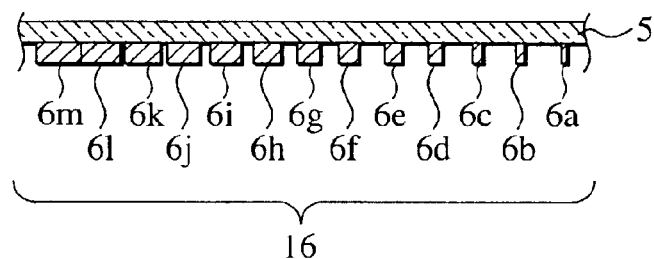

As shown in FIGS. 8A and 8B, an exposure monitor pattern 16 of a reticle 4c used for explaining the first embodiment of the present invention is a diffraction grating in which opening ratios are continuously varied by increasing widths of a plurality of opaque films 6a to 6m at a rate at which the fixed pitch P satisfies the condition of the inequality (1) on the transparent substrate 5. The opaque film 6a on the right side of the page has an opening ratio of approximately 100%, and the opaque film 6m on the left side has an opening ratio of 0%.

Figure 9A:
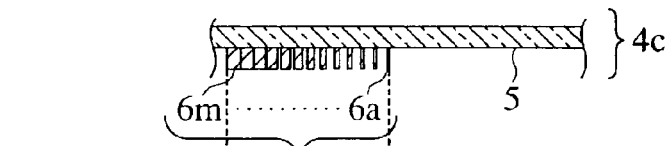
FIGS. 9A through 9C are an example for explaining the monitoring method according to the first embodiment of the present invention.
Figure 9B:
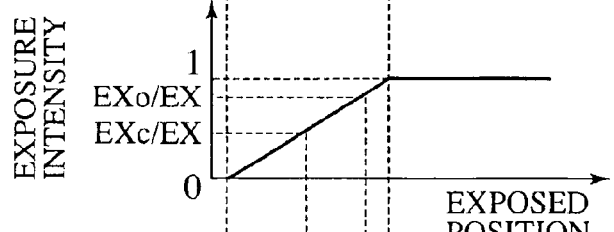
Figure 9C:

As shown in FIG. 9A, the semiconductor substrate 1 having the resist film applied thereon is exposed by illuminating the reticle 4c providing with the exposure monitor pattern 16 and an exposure dose EX. For example, if the left-side edge of the opaque film 6m of the exposure monitor pattern 16 is taken as an origin, as shown in FIG. 9B, an optical image to be obtained has a distribution in which an exposure intensity is gradually increased toward the right side and reaches approximately 1 at the right-side edge of the opaque film 6a of the exposure monitor pattern 16. The optical image is transferred to the resist film on the semiconductor substrate 1 in accordance with the sensitivity curve of the resist shown in FIG. 3. Since the exposure dose EX is sufficiently larger than the exposure dose EX0, the monitor resist pattern 13 as shown in FIG. 9C is obtained. Specifically, the resist film is left as it is at the exposed position corresponding to a range where the exposure intensity is smaller than EXc/EX, and a tilted sidewall 20 of the monitor resist pattern 13 is formed at the exposed position corresponding to a range where the exposure intensity is between EXc/EX and EX0/EX. Note that the resist film is removed at the exposed position corresponding to the range between EX0/EX and 1. Thus, as shown in FIG. 9C, the monitor resist pattern 13 is reduced and shifted with a shift width $\Delta r$ from the edge at the opaque film 6a side of the exposure monitor pattern 16. The tilt angle $\theta$ of the tilted sidewall 20 can be adjusted by changing the variation rate of the opening ratio. For example, when the opening ratio is varied stepwise by an increment of five nm width while maitaining the pitch P of the reticle 4c to be a constant 190 nm, the entire width of the exposure monitor pattern 16 is approximately 7.2 μm. Though a shift resist width in the formed monitor resist pattern 13 varies with the incident exposure dose, the tilt angle $\theta$ of the tilted sidewall 20 is kept at approximately 60 degrees. In the case of the exposure monitor pattern 16 having the varied width of the opening ratio set small at 2.5 nm, the tilt angle $\theta$ of the tilted sidewall 20 of the monitor resist pattern 13 is further reduced to approximately 25 degrees. Note that the overall length of the exposure monitor pattern 16 in this case is 14.4 μm.

As described above, based on the change rate of the opening ratio of the exposure monitor pattern 16, the shape of the sidewall of the monitor resist pattern 13 formed on the semiconductor substrate 1 can be controlled.

The monitor resist pattern 13 according to the first embodiment of the present invention, shown in FIG. 1A, is projected and transferred from the exposure monitor pattern 16 shown in FIG. 8. By using the monitor resist pattern 13 as a mask, the monitor underlying film pattern 12 formed by the RIE is reduced by the shift width $\Delta s$ compared to the monitor resist pattern 13, because the resist at the side of the tilted sidewall 20 of the monitor resist pattern 13 is etched during the RIE. The edge of the monitor underlying film pattern 12 corresponding to the steep-angle sidewall 21 of the monitor resist pattern 13 is formed at approximately the same position of the edge of the monitor resist pattern 13. Moreover, as described in FIG. 9C, the monitor resist pattern 13 is reduced by the shift resist width compared to the exposure monitor pattern 16 in the photolithography process. Therefore, the shift width $\Delta s$ is obtained in such a manner that the pattern width of the monitor resist pattern 13, after the exposure development is first provided and the pattern width of the monitor underlying film pattern 12 is obtained after the etching is subtracted therefrom.

Figure 10:
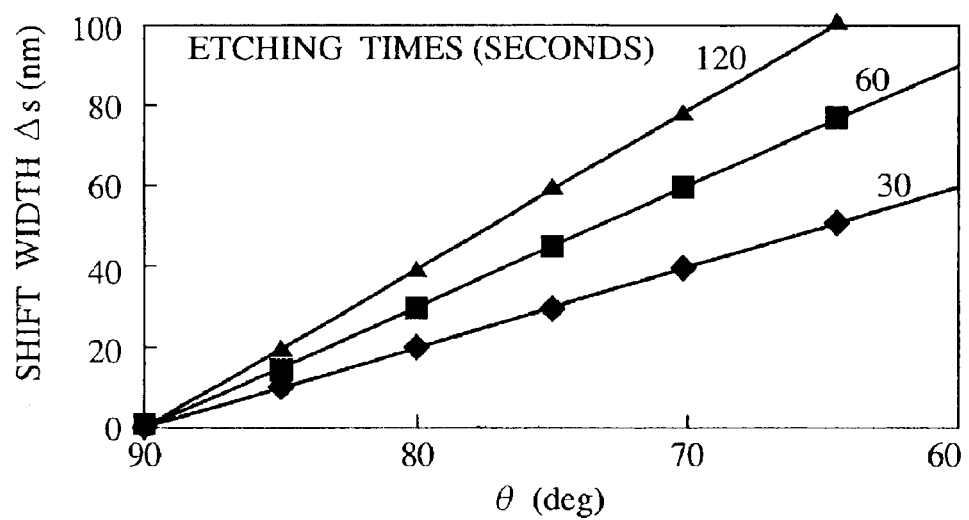
FIG. 10 is a graph showing a relationship between a shift width and a tilt angle of a sidewall, by the monitoring method according to the first embodiment of the present invention.

FIG. 10 shows a relationship between the shift width $\Delta s$ of the monitor underlying film pattern 12 and the tilt angle $\theta$ of the tilted sidewall 20 of the monitor resist pattern 13 in relation to the etching times of the RIE. As the tilt angle $\theta$ gets smaller and the cross-section shape of the monitor resist pattern 13 starts to flatten, the shift width $\Delta s$ increases and the change of the shift width $\Delta s$ becomes larger depending on the etching time. For example, when the monitor resist pattern 13 having the tilt angle $\theta$ of 60 degrees is used, the shift width $\Delta s$ of the monitor underlying film pattern 12 is approximately 90 nm at 60 seconds of the RIE time. Moreover, even when considering the reduction of the monitor resist pattern 13 in the photolithography process, the monitor underlying film pattern 12 can be formed to have a width of several μm. An optical measuring method can be applied without a non-optical measuring technique such as SEM using charged beams. The entire width of the monitor underlying film pattern 12 shown in FIG. 10 is approximately 6 μm. For the measurement of the shift width $\Delta s$ of FIG. 10, an overlay inspection system is used. The measurement accuracy of the overlay inspection system is ±1 nm. Thus, compared to the measurement accuracy of the SEM, which is ±5 nm, the shift width $\Delta s$ can be measured with higher accuracy by the overlay inspection system.

Figure 14:
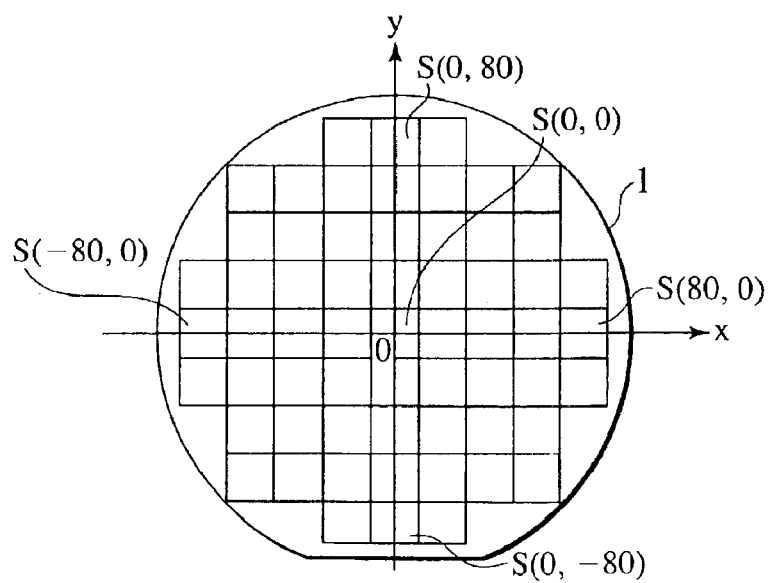
FIG. 14 is a view showing an exposure field position on a semiconductor substrate by the aligner of FIG. 2.

With reference to FIGS. 11A through 11E, a process of executing the monitoring method according to the first embodiment of the present invention will be described. The semiconductor substrate 1 used here is a Si semiconductor substrate having a diameter of 200 mm, as shown in FIG. 14. Positions on the surface of the semiconductor substrate 1 are expressed by position coordinates (x, y) while taking the center of the semiconductor substrate 1 as the origin point (0, 0). Herein, units of the coordinates x and y are expressed in millimeters. Moreover, an exposure field position of the aligner 50 on the semiconductor substrate 1 is S(x, y).

Herein, S(x, y) is expressed by the center coordinate (x, y) of a 20 mm square exposure field. The exposure field position S(0, 0) is a square field designated by the positional coordinates (−10, −10), (−10, 10), (10, 10) and (10, −10). Moreover, the exposure field positions are S(−80, 0), S(−60, 0), S(−40, 0), . . . , S(80, 0) along the x axis, and are S(0, −80), S(0, −60), S(0, −40), . . . , S(0, 80) along the y axis. In the entire semiconductor substrate 1 having a diameter of 200 mm, there are a total of 61 exposure field positions as drawn in a lattice form in FIG. 14.

Figure 11A:
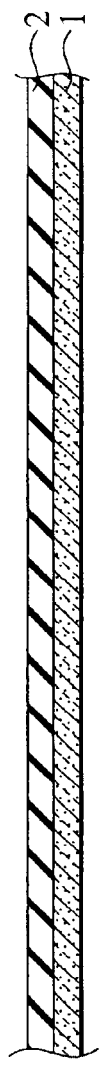
FIGS. 11A through 11E are an example of cross sections of the steps for explaining the monitoring method according to the first embodiment of the present invention.
Figure 11B:

(a) With the condition described above, first, as shown in FIG. 11A, an underlying film 2 having a thickness of 200 nm is formed on the semiconductor substrate 1. Furthermore, on the underlying film 2, a resist film 3 having a thickness of 600 nm is formed by spin coating, as shown in FIG. 11B.

Figure 12:
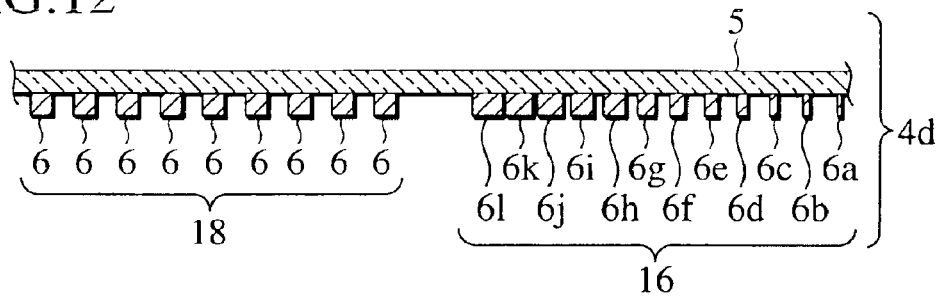
FIG. 12 is a cross-sectional view showing an example of the reticle used in the monitoring method according to the first embodiment of the present invention.

(b) Using the aligner 50 shown in FIG. 2, patterns of a reticle 4d shown in FIG. 12 are exposed on the resist film 3 on the surface of the semiconductor substrate 1. Herein, in the reticle 4d, a line/space (L/S) pattern 18 and an exposure monitor pattern 16 according to the first embodiment of the present invention are provided on the transparent substrate 5. As shown in FIG. 12, the L/S pattern 18 and the exposure monitor pattern 16 have a plurality of opaque films 6 and opaque films 6a to 6l, all of which are provided as extending in a direction vertical to the page and arranged at constant pitches. In the L/S pattern 18, the width of each of the opaque films 6 is set to a constant value of 150 nm and the pitch therebetween is set to a constant value of 300 nm. In the exposure monitor pattern 16, the pitch is set to a constant value of 190 nm and the width of each of the opaque films 6a to 6l is varied at a constant increment rate in the order of 6a to 6l. In the first embodiment, the increment in the width of the opaque films 6a to 6l in the exposure monitor pattern 16 is 5 nm, and the exposure monitor pattern 16 are represented by the opaque films 6a to 6l in FIG. 12 for the sake of simplicity. However, the exposure monitor pattern 16 actually includes 38 opaque films with the overall length of 7.2 μm. As described above, in accordance with the pitch condition as expressed in the inequality (1), the L/S pattern 18 is resolved on the semiconductor substrate 1 and the exposure monitor pattern 16 is not resolved thereon.

Figure 11C:
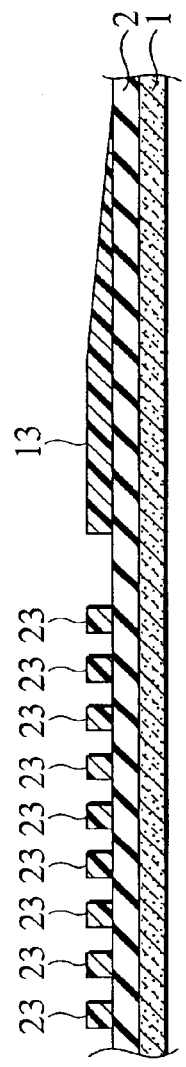
Figure 11D:
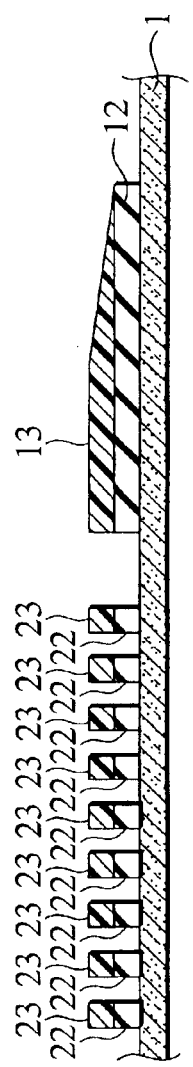

(c) A development processing is performed after the exposure of the resist film 3, and thus resist lines 23 in L/S resist pattern and a monitor resist pattern 13 are obtained as shown in FIG. 11C. Finished widths of the resist lines 23 and the monitor resist pattern 13 are respectively measured by the SEM and the overlay inspection system including a mounted CCD camera. The overlay inspection system optically measures a pattern length by an image analysis.

(d) Next, as shown in FIG. 1D, by using the resist lines 23 of the L/S resist pattern and the monitor resist pattern 13 as a mask, the underlying film 2 is etched by the anisotropic RIE. Thus, underlying film lines 22 of a L/S underlying film pattern and the monitor underlying film pattern 12 are formed.

Figure 11E:
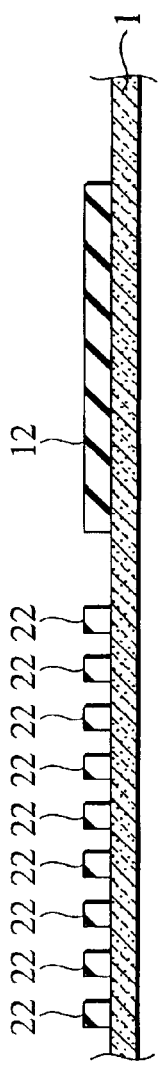

(e) Finally, the resist lines 23 and the monitor resist pattern 13 are removed by a resist stripper, and as shown in FIG. 11E, the underlying film lines 22 of the L/S underlying film pattern and the monitor underlying film pattern 12 are obtained on the semiconductor substrate 1. Then, finished widths of the underlying film lines 22 and the monitor underlying film pattern 12 are measured. The measurement thereof is performed by the same apparatus using for the resist lines 23 and the monitor resist pattern 13.

Figure 13A:
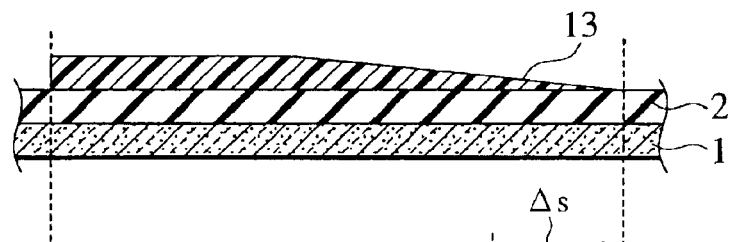
FIGS. 13A and 13B are cross-sectional views showing an example of a monitor resist pattern and a monitor underlying film pattern, obtained in the steps for explaining the monitoring method according to the first embodiment of the present invention.
Figure 13B:
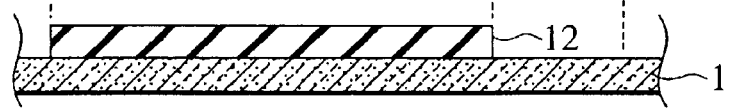

The shape of the monitor resist pattern 13 transferred from the exposure monitor pattern 16 and the shape of the monitor underlying film pattern 12 thereof after the RIE etching are shown in FIGS. 13A and 13B, respectively. At the steep-angle sidewall of the monitor resist pattern 13, shown on the left side of the page, the edge positions of the monitor resist pattern 13 and the monitor underlying film pattern 12 coincide with each other. However, it is apparent that, at the side of the tilted sidewall, the edge of the monitor underlying film pattern 12 is reduced. The overlay inspection system performs the image analysis of the monitor resist pattern 13 and the monitor underlying film pattern 12 to measure the overall widths thereof and to obtain the shift width Δs from the difference therebetween.

Figure 15A:
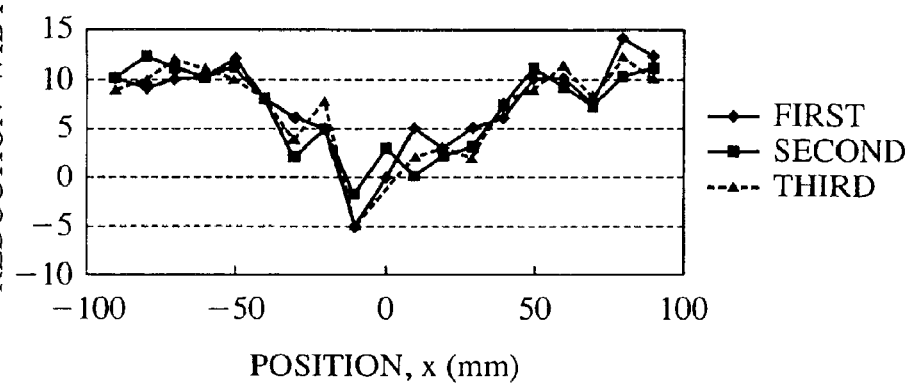
FIGS. 15A and 15B are graphs showing an example of a distribution of reduction widths of a line/space underlying film pattern and an example of a distribution of shift widths of a monitor underlying film pattern, by the monitoring method according to the first embodiment of the present invention.
Figure 15B:
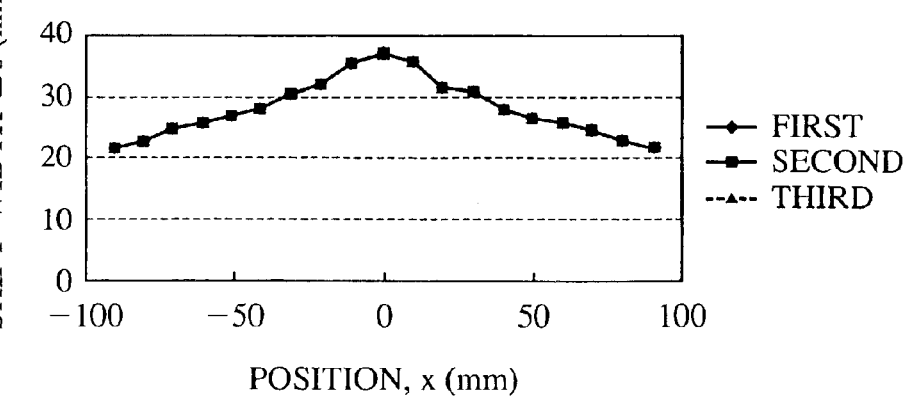

FIG. 15A shows a distribution of reduction widths of the underlying film lines 22 of the L/S underlying film pattern from the resist lines 23 of the L/S resist pattern, measured by the SEM. FIG. 15B shows a distribution of the shift widths Δs of the monitor underlying film pattern 12 from the monitor resist pattern 13, measured by the overlay inspection system. The respective width measurements are conducted three times in succession. Note that, in the SEM measurement, a discharge processing is performed just after the respective measurements. The horizontal axis of FIGS. 15A and 15B represents a position x in a diameter direction at y=0 along the x axis direction of the semiconductor substrate 1.

In the measurement using the SEM, the insulating film such as the resist film or the underlying film is charged up due to the electron beams and thus measured values are likely to scatter. As shown in FIG. 15A, the results of the three measurements have large variations therebetween. In the case of the SEM measurement, in order to ensure a sufficient measurement accuracy, an average of the measured values needs to be obtained by increasing the number of measurements. Furthermore, in order to eliminate the occurrence of charging up, a discharge processing such as retrieving a sample from a vacuum chamber of the SEM needs to be performed for each measurement. Thus, it takes time to perform the measurements. In the result of the measurement of the reduction widths, shown in FIG. 15B, the measured values obtained from the three measurements show approximately the same value. Thus, it is conceivable that a sufficient measurement accuracy is obtained. The overlay inspection system is an optical type, and thus the measurement can be easily performed with a good reproducibility without the occurrence of the charging up problem. The measurement results show a similar tendency between the reduction width and the shift width Δs in terms of reducing the pattern width. In the central portion of the semiconductor substrate 1, the reduction width is small and the shift width Δs is large. In other words, the progress of the etching in the central portion of the semiconductor substrate 1 may be faster than that of the peripheral portion thereof.

Note that, in the first embodiment of the present invention, the influence of the dry etching is investigated by the shift width Δs of the monitor underlying film pattern 12. However, it is needless to say that a similar measurement is possible by detecting a shift of a center position of the monitor underlying film pattern 12, instead of using the shift width Δs.

As described above, by the monitoring method according to the first embodiment of the present invention, the influence of dry etching to the formation of the underlying film pattern, can be easily measured with high accuracy and good reproducibility.

(Modified Example of the First Embodiment)

Next, description will be made for a monitoring method according to a modified example of the first embodiment of the present invention. In the modified example of the first embodiment, an exposure monitor pattern is different from the first embodiment and other points besides the exposure monitor pattern are similar to those of the first embodiment. Thus, repetitive description thereof will be omitted.

In order to efficiently perform a line width monitoring for various etching conditions used in dry etching, in the modified example of the first embodiment, a resist pattern is used, in which both of opposing sidewalls are tilted. Furthermore, a plurality of resist patterns having a variety of tilt angles θ are provided.

Figure 16:
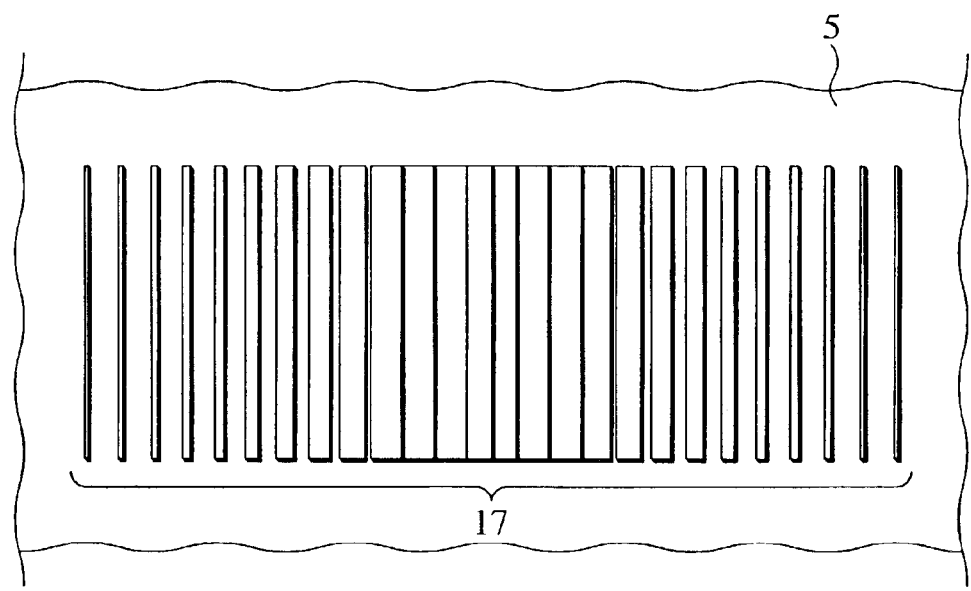
FIG. 16 is a view showing an example of a reticle for explaining the monitoring method according to a modified example of the first embodiment of the present invention.
Figure 17A:
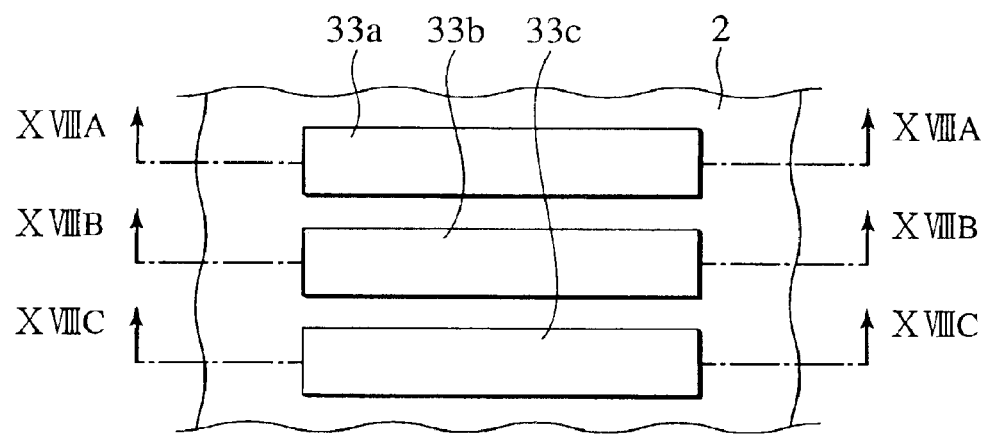
FIGS. 17A and 17B are examples of plan views showing a monitor resist pattern and a monitor underlying film pattern, obtained by a monitoring method according to a modified example of the first embodiment of the present invention.
Figure 17B:
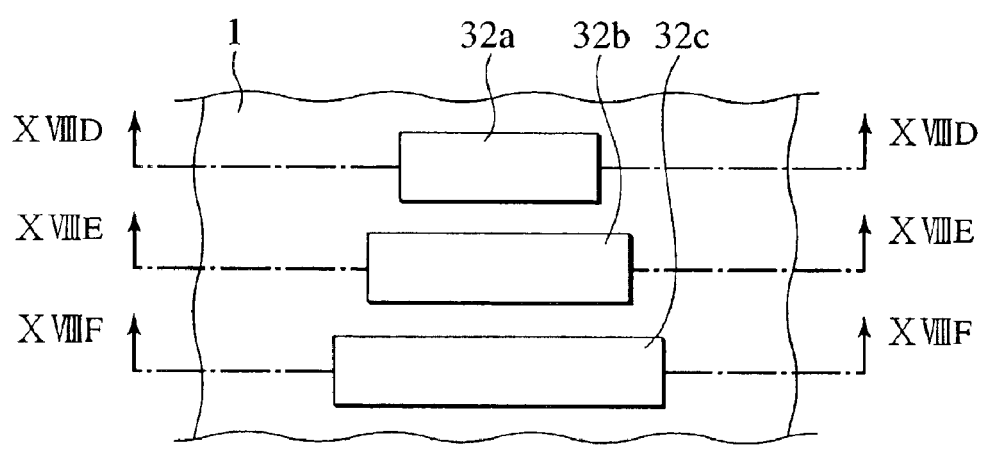
Figure 18A:
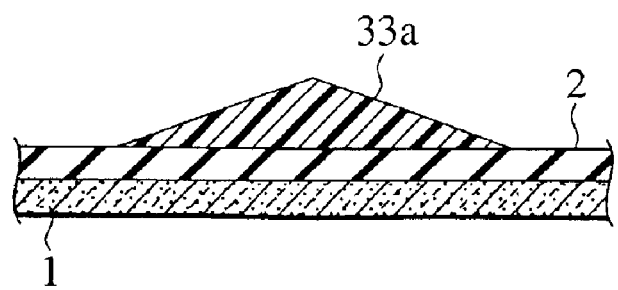
FIGS. 18A through 18F are cross-sectional views showing examples of the monitor resist pattern and the monitor underlying film pattern, obtained by the monitoring method according to the modified example of the first embodiment of the present invention.
Figure 18B:
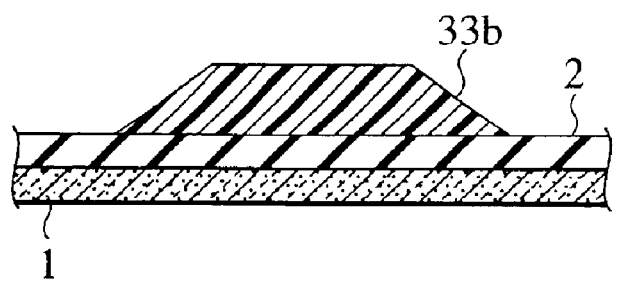
Figure 18C:
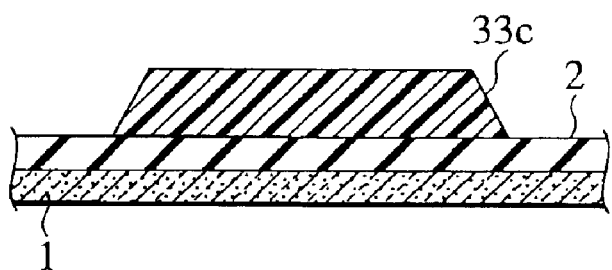
Figure 18D:
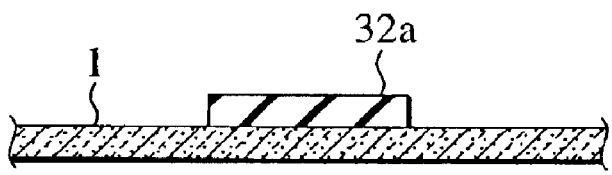
Figure 18E:
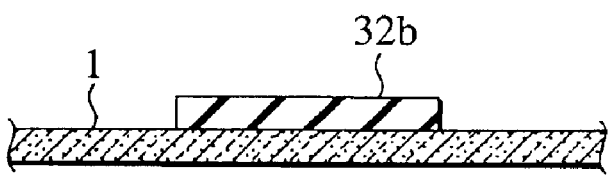
Figure 18F:
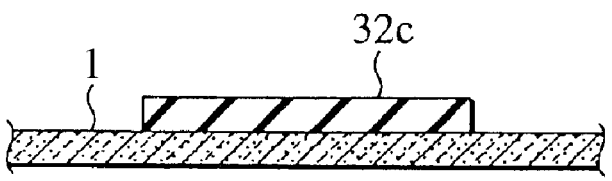

For the reticle used in the modified example of the first embodiment, as shown in FIG. 16, an exposure monitor pattern 17 having a diffraction grating with a bilateral symmetry is provided. Specifically, in the exposure monitor pattern 17, opening ratios are varied from approximately 0 to 100% at a constant rate from the center thereof toward both ends by a constant pitch on a transparent substrate 5. Furthermore, a plurality of exposure monitor patterns, which have a symmetrical shape similar to that of the exposure monitor pattern 17 and that have different variation rates of the opening ratios, are prepared. Thus, a plurality of monitor resist patterns having different sidewall shapes as shown in FIG. 17A and FIGS. 18A to 18C are formed. The respective cross sections XVIIIA, XVIIIB and XVIIIC of the monitor resist patterns 33a, 33b and 33c of FIG. 17A are symmetrical, respectively, as shown in FIGS. 18A to 18C. However, the tilt angles θ of the tilted sidewalls in the respective cross sections are mutually different. By using the monitor resist patterns 33a, 33b and 33c as a mask, RIE is performed. Thus, monitor underlying film patterns 32a, 32b and 32c as shown in FIG. 17B are provided. In FIG. 18B, the cross sections XVIIID, XVIIIE and XVIIIF of the respective monitor underlying film patterns 32a, 32b and 32c are shown.

In the modified example, the opposing sidewalls of the monitor resist patterns 33a to 33c are tilted sidewalls which are mutually symmetrical. Thus, shift widths of the foundation silicon oxide film pattern 32a to 32c doubles, thereby enabling a highly accurate measurement. Moreover, the plurality of monitor resist patterns 33a to 33c having the different tilt angles θ are provided. Thus, based on the RIE condition, a pattern having the highest sensitivity to the measurement of the shift width due to the etching can be selected thereamong and used, which can be effective.

As described above, a monitoring method can be provided according to the modified example of the first embodiment of the present invention, in which the influence of dry etching on the formation of the underlying film pattern can be easily measured with high accuracy and good reproducibility.

Second Embodiment

Figure 19:
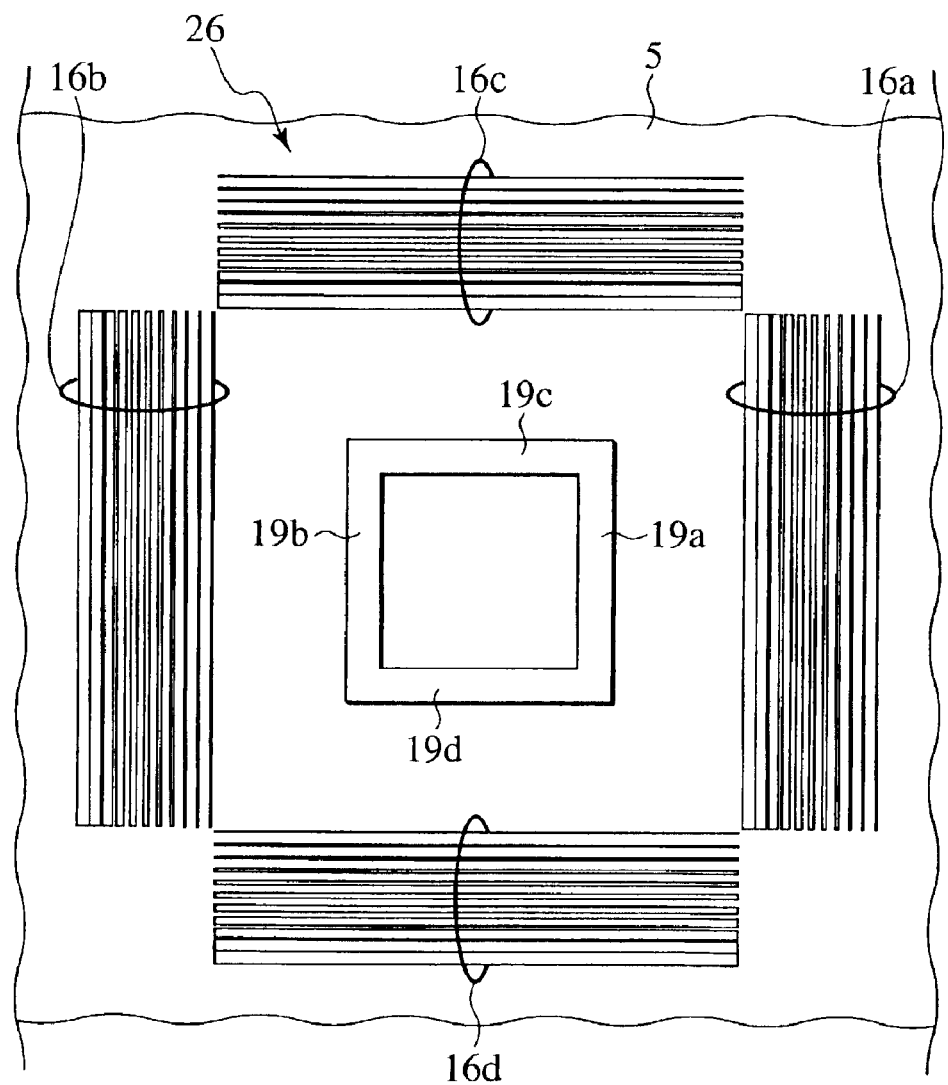
FIG. 19 is a plan view showing an example of a shift monitor pattern for explaining a monitoring method according to a second embodiment of the present invention.

In a monitoring method according to a second embodiment of the present invention, as shown in FIG. 19, a reticle having a shift monitor pattern 26 provided on a transparent substrate 5 is used. Specifically, the shift monitor pattern 26 includes reference patterns 19a to 19d having a square frame shape of uniform opaque films, and exposure monitor patterns 16a to 16d disposed outside the reference patterns 19a to 19d to surround the same. As shown in FIG. 19, opening ratios of the exposure monitor patterns 16a and 16b are made larger toward the right side of the page and opening ratios of the exposure monitor patterns 16c and 16d are made larger toward the upper side of the page. Accordingly, tilted sidewalls are formed in a resist film to be exposed. By using the resist pattern having tilted sidewalls as a mask, when a dry etching is performed, a positional shift of the outside underlying film pattern is obtained relative to a position of the inside underlying film pattern. Consequently, the progress of the dry etching can be determined.

The monitoring method according to the second embodiment of the present invention has a characteristic of measuring a shift variance between two kinds of patterns having different shifting properties due to the dry etching process. Other points besides the above characteristic are similar to those of the first embodiment. Thus, repetitive description thereof will be omitted.

With reference to FIGS. 20A to 20E, description will be given for a process of executing the monitoring method according to the second embodiment of the present invention.

Figure 20A:
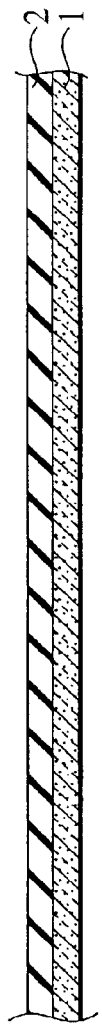
FIGS. 20A through 20E are an example of cross sections of the steps for explaining the monitoring method according to the second embodiment of the present invention.
Figure 20B:
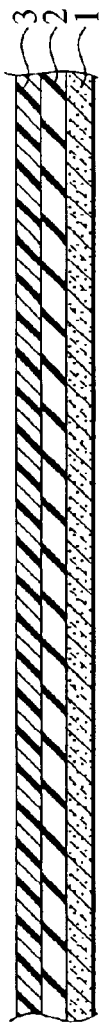

(a) First, as shown in FIG. 20A, an underlying film 2 having a thickness of 200 nm is formed on a semiconductor substrate 1. Then, on the underlying film 2, as shown in FIG. 20B, a resist film 3 having a thickness of 600 nm is formed by spin coating.

(b) Using the aligner 50 shown in FIG. 2, patterns of a reticle 4e shown in FIG. 21 are exposed on the resist film 3 on the surface of the semiconductor substrate 1. Herein, in the reticle 4e, a L/S pattern 18, and the shift monitor pattern 26 including the reference patterns 19a and 19b and the exposure monitor patterns 16a and 16b, are disposed on the transparent substrate 5. As shown in FIG. 21, the L/S pattern 18 has a plurality of opaque films 6, which are provided as extending in a direction vertical to the page and arranged at the constant pitch P, respectively. For example, in the L/S pattern 18, the pitch is 300 nm and the width of the opaque film 6 is a constant 150 nm. In the exposure monitor patterns 16a and 16b, the pitch is 190 nm, and the width of each of the opaque films is increased at a constant rate of 5 nm. The pattern length of the exposure monitor patterns is 7.2 μm. A distance between the centers of the respective exposure monitor patterns 16a and 16b is 25 μm. The reference patterns 19a and 19b are disposed between the exposure monitor patterns 16a and 16b, the width thereof is 1 μm and a distance between the centers thereof is 10 μm. Herein, the L/S pattern 18 and the reference patterns 19a and 19b are resolved on the semiconductor substrate 1, and the exposure monitor patterns 16a and 16b are not resolved thereon.

Figure 20C:
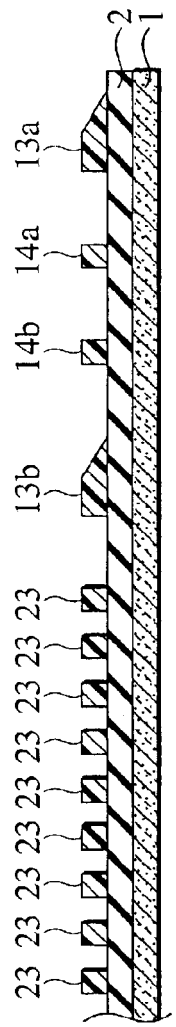

(c) A development processing is performed after the exposure, and as shown in FIG. 20C, resist lines 23 of the L/S resist pattern, monitor resist patterns 13a, 13b and reference resist patterns 14a, 14b are obtained. By using the overlay inspection system, a pattern center position of all of the monitor resist patterns 13a, 13b and a pattern center position of all of the reference resist patterns 14a, 14b, are respectively measured.

Figure 20D:
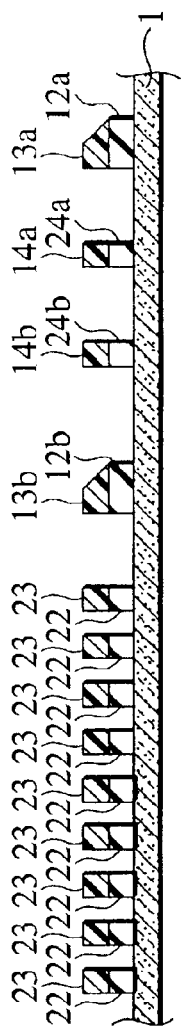

(d) Next, as shown in FIG. 20D, by using the resist lines 23 of the L/S resist pattern, the monitor resist patterns 13a, 13b and the reference resist patterns 14a, 14b as a mask, the underlying film 2 is etched by an RIE. Thus, underlying film lines 22 of a L/S underlying film pattern, monitor underlying film patterns 12a, 12b and reference position underlying film patterns 24a, 24b are formed.

Figure 20E:
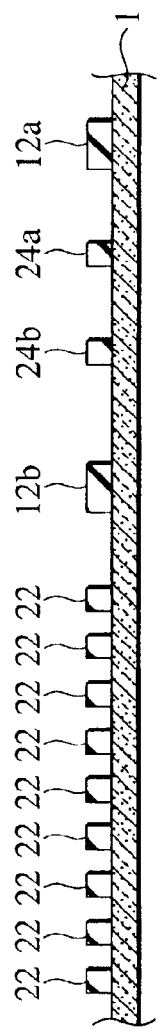

(e) Finally, the resist lines 23, the monitor resist patterns 13a, 13b and the reference resist patterns 14a, 14b are removed by a resist stripper, and as shown in FIG. 20E, the underlying film lines 22 of the L/S underlying film pattern, the monitor underlying film patterns 12a, 12b and the reference position underlying film patterns 24a, 24b are provided on the semiconductor substrate 1. By using an overlay inspection system, a pattern center position of all of the monitor underlying film patterns 12a, 12b and a pattern center position of all of the reference position underlying film patterns 24a, 24b in totality, are respectively measured.

Figure 23A:
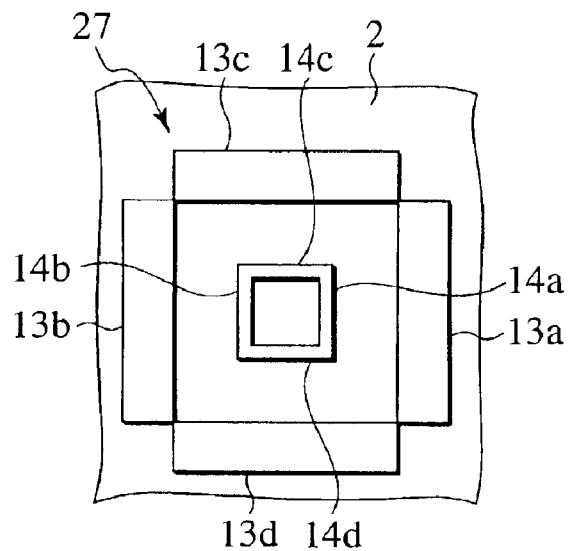
FIGS. 23A and 23B are examples of plan views showing a shift monitor resist pattern and a shift monitor underlying film pattern, obtained by the monitoring method according to the second embodiment of the present invention.
Figure 23B:
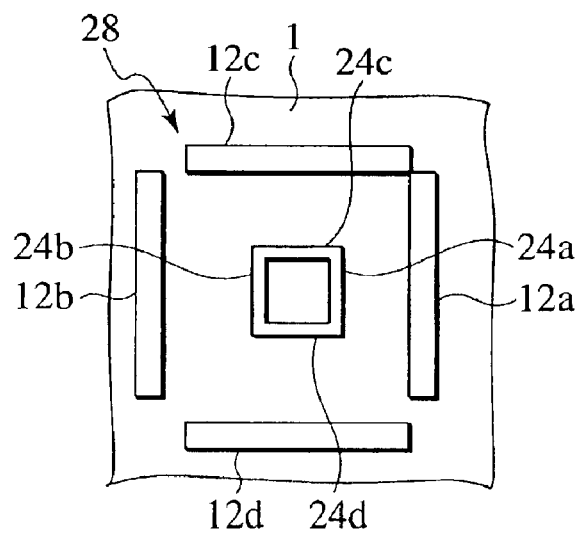

The shape of the resist patterns transferred by exposure of the reference patterns 19a and 19b and the exposure monitor patterns 16a and 16b and the shape of the underlying film patterns obtained by performing the RIE using the resist patterns as a mask are shown, respectively, in FIGS. 22A, 22B and FIGS. 23A, 23B. Herein, for the sake of simplicity, as shown in FIG. 22A, a pattern center Ca of all of the reference resist patterns 14a, 14b and a pattern center Cb of all of the monitor resist paterns 13a, 13b, are assumed to be located in the same position on the semiconductor substrate 1. As shown in FIG. 22B, after the dry etching, the position of the pattern center Ca of the reference position underlying film patterns 24a, 24b coincides with the position of the pattern center Ca of the reference resist patterns 14a, 14b. Also, the position of the pattern center Cb' of the monitor underlying film patterns 12a, 12b shifts from the position of the pattern center Cb of the monitor resist patterns 13a, 13b by a shift width Δc. In FIGS. 23A and 23B, a shift monitor resist pattern 27 and a shift monitor underlying film pattern 28 is shown in its entirety. As shown in FIG. 23A, the monitor resist patterns 13a to 13d have the tilted sidewalls at the right side and upper side of the page, and the reference resist patterns 14a to 14d have steep-angle sidewalls. The position of the pattern center of the monitor underlying film patterns 12a to 12d after the dry etching shifts leftward towards the bottom of the page relative to a square pattern composed of the reference underlying film patterns 24a to 24d. As described above, according to the second embodiment, not only a one-dimensional shift width but also a two-dimensional shift width can be used as the shift width Δc of the pattern center. Thus, a highly accurate measurement is possible.

As described above, according to the second embodiment, a monitoring method can be provided, which is capable of easily measuring the influence of the dry etching with high accuracy and good reproducibility.

Figure 24:
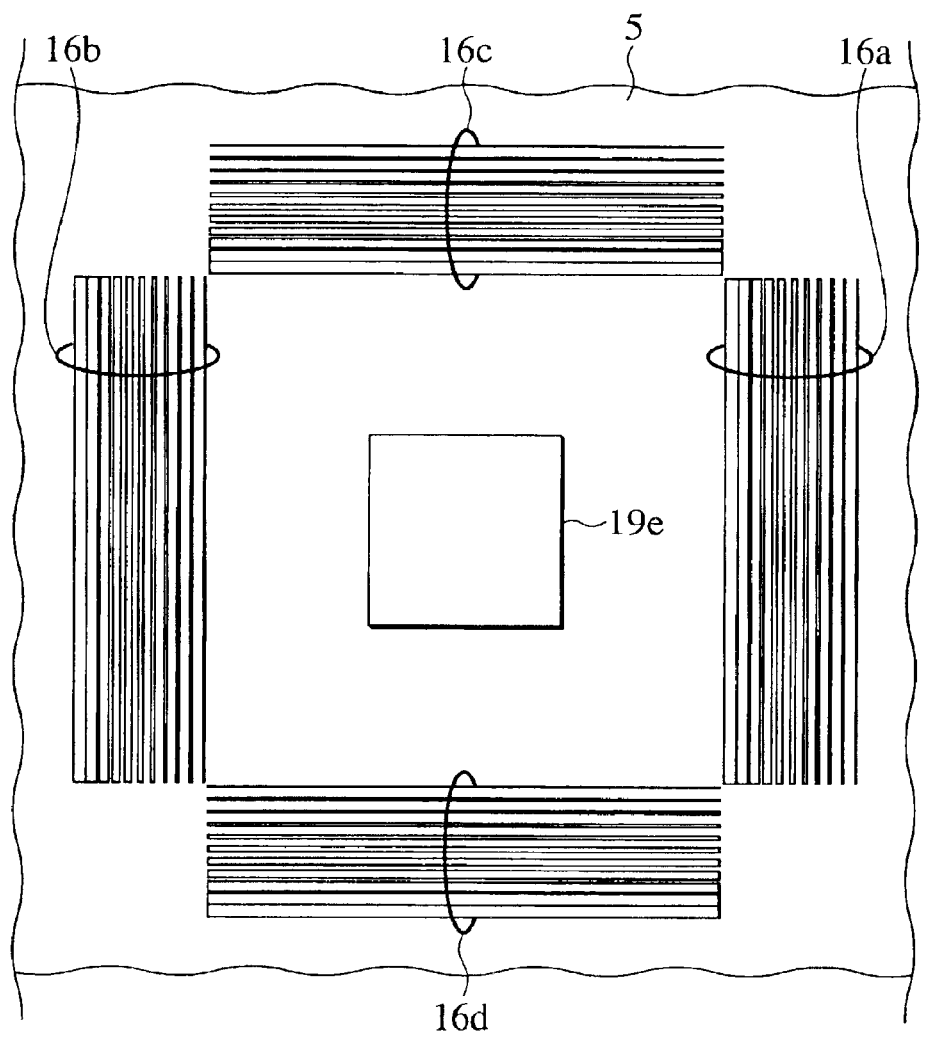
FIG. 24 is a plan view showing another example of the shift monitor pattern for explaining the monitoring method according to the second embodiment of the present invention.

Herein, in the second embodiment of the present invention, although the reference patterns 19a to 19d have the square frame shape, the reference patterns 19a to 19d may have any shape as long as the position of the pattern center is not shifted by the dry etching. FIG. 24 shows one example. In FIG. 24, a reticle is shown, in which a reference pattern 19e having a square shape is disposed relative to the exposure monitor patterns 16a to 16d on the transparent substrate 5. It is apparent that the center position of the underlying film pattern corresponding to the reference pattern 19e stays the same with respect to the resist pattern transferred from the reference pattern 19e. The center position thereof can be used as a reference position to the shifts in the underlying film patterns corresponding to the exposure monitor patterns 16a to 16d.

Figure 25:
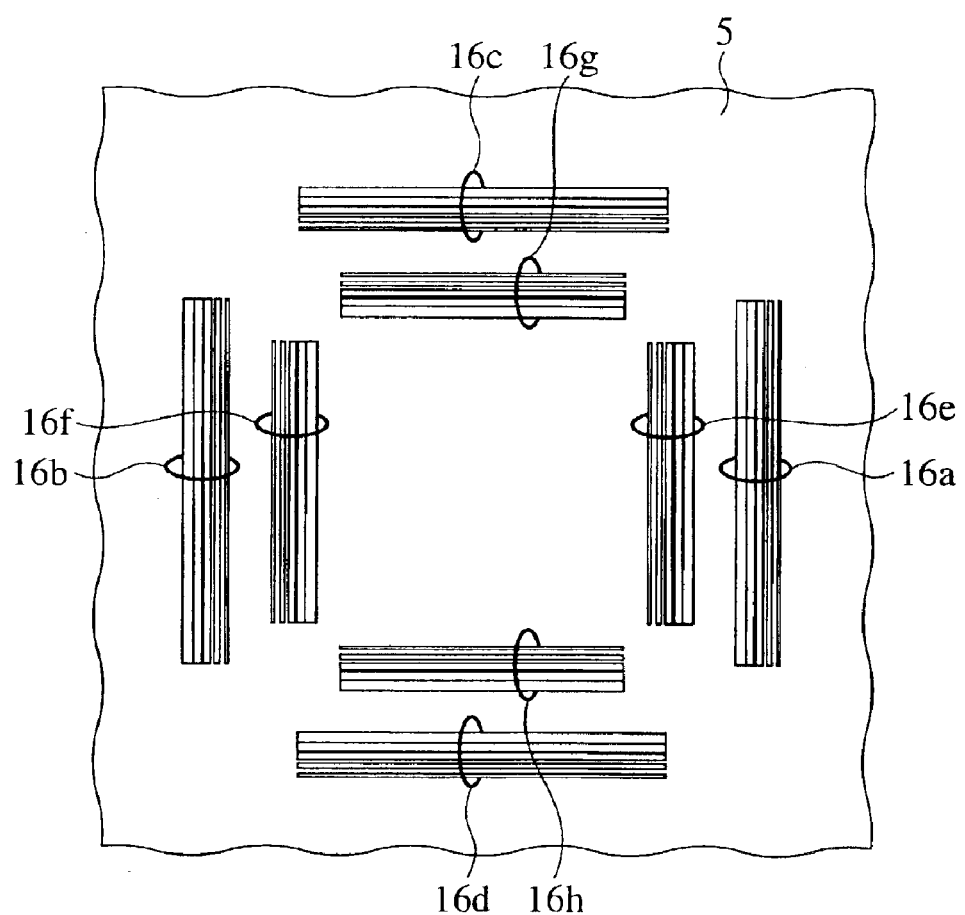
FIG. 25 is a plan view showing still another example of the shift monitor pattern for explaining the monitoring method according to the second embodiment of the present invention.

Moreover, in the example of the second embodiment described above, two different kinds of patterns are formed and the shift width is measured in such a manner that the center position of one of the two patterns is not shifted even by the dry etching. However, a combination of patterns so as to have shift widths being different from each other due to the dry etching may be used. From the viewpoint of increasing the measurement accuracy, such a combination of patterns that have the shift widths in directions opposite to each other is desirable. For example, as shown in FIG. 25, a reticle, in which the exposure monitor patterns 16a to 16h are provided on the transparent substrate 5, may be used. Each of the exposure monitor patterns 16a, 16b, 16e and 16f has the diffraction grating pattern extending in the vertical direction on the page. Each of the exposure monitor patterns 16e and 16f has a direction of varying the opening ratio opposite to the direction of varying the opening ratio of the exposure monitor patterns 16a and 16b. Each of the exposure monitor patterns 16c, 16d, 16g and 16h has the diffraction grating pattern extending in the left and right direction on the page. Each of the exposure monitor patterns 16g and 16h has a direction of varying the opening ratio opposite to the direction of varying the opening ratio of the exposure monitor patterns 16c and 16d. When the underlying film is dry-etched using the resist pattern transferred from the exposure monitor patterns 16a to 16d, the monitor underlying film patterns is shifted, for example, in the upper-left direction. Also, the monitor underlying film pattern formed from the exposure monitor patterns 16e to 16h is shifted in the lower-right direction that is opposite to the above-described direction for the monitor underlying film patterns formed from the exposure monitor patterns 16a to 16d. In such a manner, since the directions in which the patterns are shifted are opposite to each other, the shift width Δc measured becomes large. Thus, the measurement can be performed far more easily with higher accuracy.

Moreover, in FIG. 22, description has been made that the pattern center Ca of the reference resist patterns 14a and 14b and the pattern center Cb of the monitor resist patterns 13a and 13b coincide with each other. However, it is needless to say that the respective pattern centers Ca and Cb may not coincide with each other. For example, by setting Ca as a reference, in which the pattern center does not shift by the photolithography or dry etching process, the pattern center Cb of the monitor resist patterns 13a and 13b and the pattern center Cb' of the monitor underlying film patterns 12a and 12b may be measured. Then, based on a difference between the measured positions of the pattern centers Ca and Cb', the shift width Δc may be obtained.

Moreover, in FIG. 19, an example is described with the reference patterns 19a to 19d surrounded by the exposure monitor patterns 16a to 16d and positioned at the central portion of the shift monitor pattern 26. However, the positions for locating the reference patterns 19a to 19d may be in any positions in a portion surrounded by the exposure monitor patterns 16a to 16d. Moreover, it is needless to say that a part of the reference patterns 19a to 19d may be positioned outside of the exposure monitor patterns 16a to 16d or the entire reference patterns 19a to 19d may be positioned outside thereof.

According to the monitoring method of the second embodiment of the present invention, the influence of dry etching on the formation of the underlying film pattern can be easily measured with high accuracy and good reproducibility.

Third Embodiment

Figure 26:
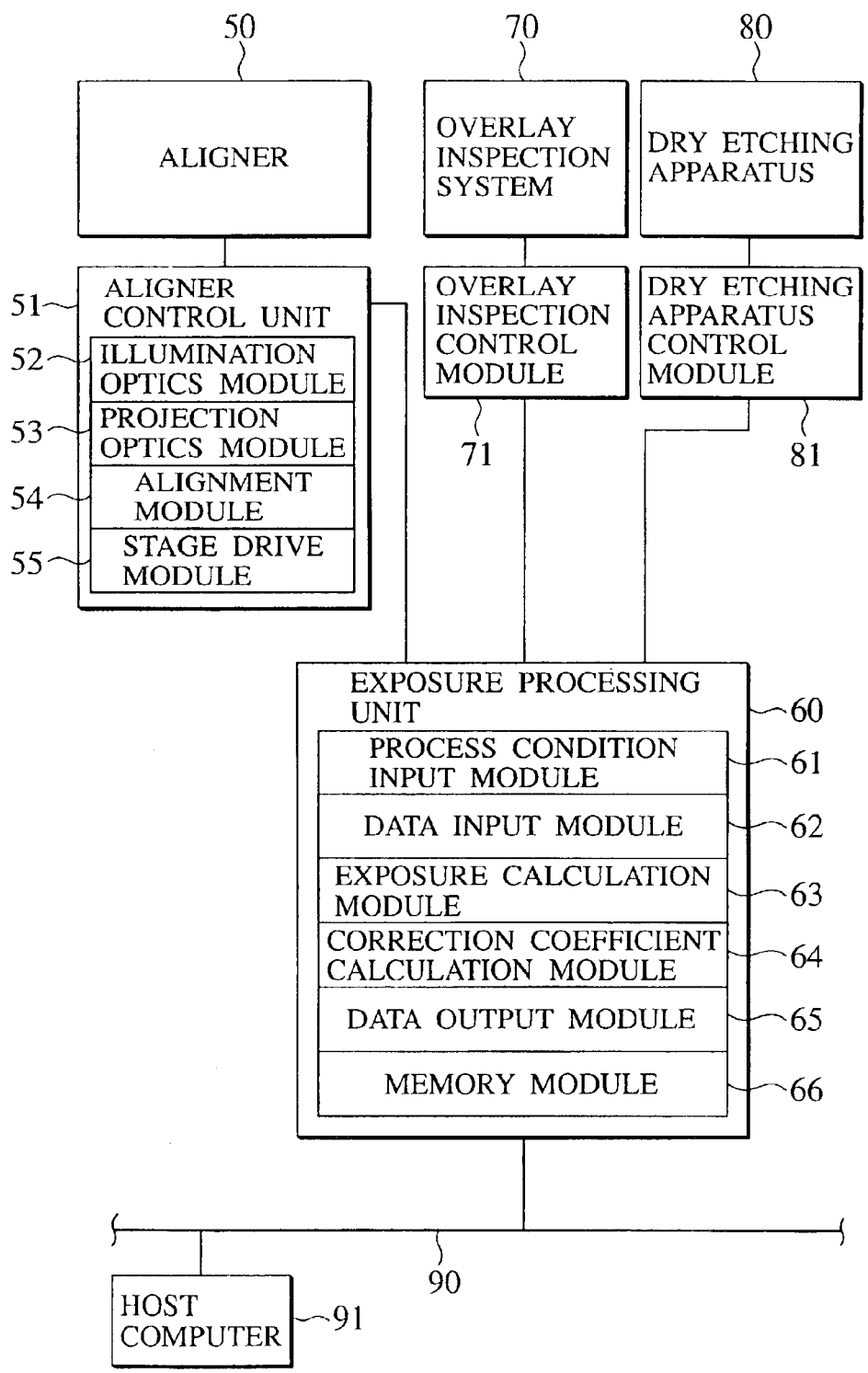
FIG. 26 is a schematic constitutional view of an aligner control system used in an exposure method according to the second embodiment of the present invention.

An aligner control system for controlling an aligner 50 according to a third embodiment of the present invention, as shown in FIG. 26, includes an aligner control unit 51 and an exposure processing unit 60.

The aligner 50 is the stepper shown in FIG. 2. The aligner control unit 51 includes an illumination optics module 52 for controlling collimation, turning on/off and the like of incident light from a light source, a projection optics module 53 for controlling reduced projection and the like of an exposure pattern of a reticle, an alignment module 54 for controlling alignment of the exposure pattern, and a stage drive module 55 for controlling a location of a stage.

The exposure processing unit 60 includes a process condition input module 61 for providing etching conditions and the like of a dry etching apparatus 80 from a dry etching apparatus control module 81, a data input module 62 for obtaining data measured by an overlay inspection system 70 from an overlay inspection control module 71, an exposure calculation module 63 for calculating an effective exposure dose from the measured data input by the data input module 62, a correction coefficient calculation module 64 for calculating an exposure correction coefficient from the calculated effective exposure dose, a data output module 65 for setting an exposure condition based on the calculated correction coefficient, and a memory module 66 for storing exposure control information. The exposure processing unit 60 is connected to a local area network (LAN) 90 and controlled by a host computer 91.

In an exposure method of a circuit pattern for a semiconductor device according to the third embodiment of the present invention, for example, a reticle 4d shown in FIG. 12, is used, in which a L/S pattern 18 and an exposure monitor pattern 16 are positioned. An exposure correction coefficient is provided based on a relationship between an exposure dose and a shift width of a monitor resist pattern 13. Then, an effective exposure dose for each exposure field of the semiconductor substrate 1 is set by use of the exposure correction coefficient.

Figure 27:
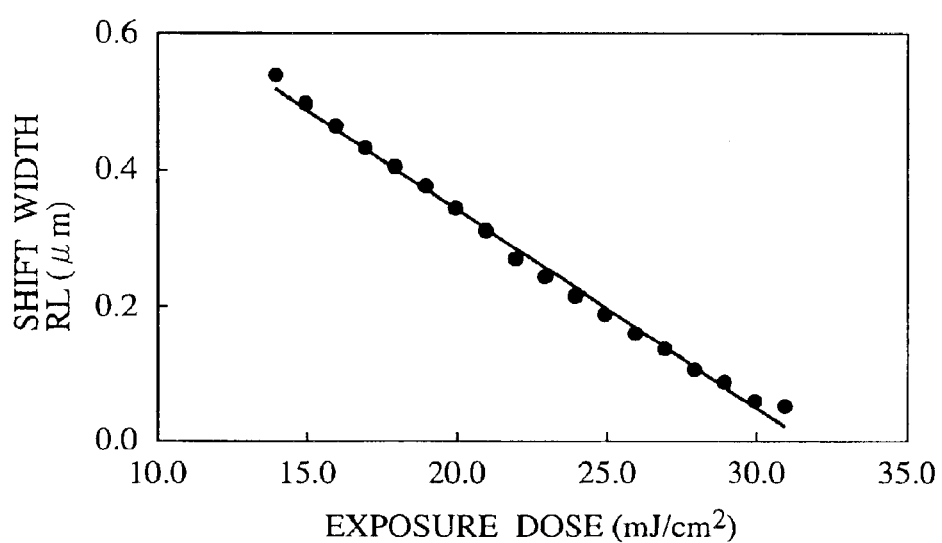
FIG. 27 is a graph showing a relationship between a shift width of a resist pattern and an exposure dose for explaining the exposure method according to the second embodiment of the present invention.

First, in order to obtain the relationship between the shift width of the monitor resist pattern 13 and the effective exposure dose, a resist film coated on the semiconductor substrate 1 is exposed by changing a setting value of the exposure dose using the reticle 4d having the exposure monitor pattern 16 shown in FIG. 8. Then, a relative shift width of the monitor resist pattern 13 is measured by the overlay inspection system 70. Note that the shift width may be provided by taking a difference between a measured shift width Δr and an arbitrary reference value set in the overlay inspection system 70. Therefore, the value of the relative shift width is not necessarily coincident with the shift width Δr itself by which the edge of the monitor resist pattern 13 is reduced. As a result, the relationship between the exposure dose and the relative shift width RL, as shown in FIG. 27, is obtained. Based on the relationship of FIG. 27, an equation for obtaining the effective exposure dose from the relative shift width RL is derived by use of a least-squares method.

$$ED = -34.4*RL + 31.8 \quad (2)$$

Herein, ED denotes the effective exposure dose.

Figure 28:
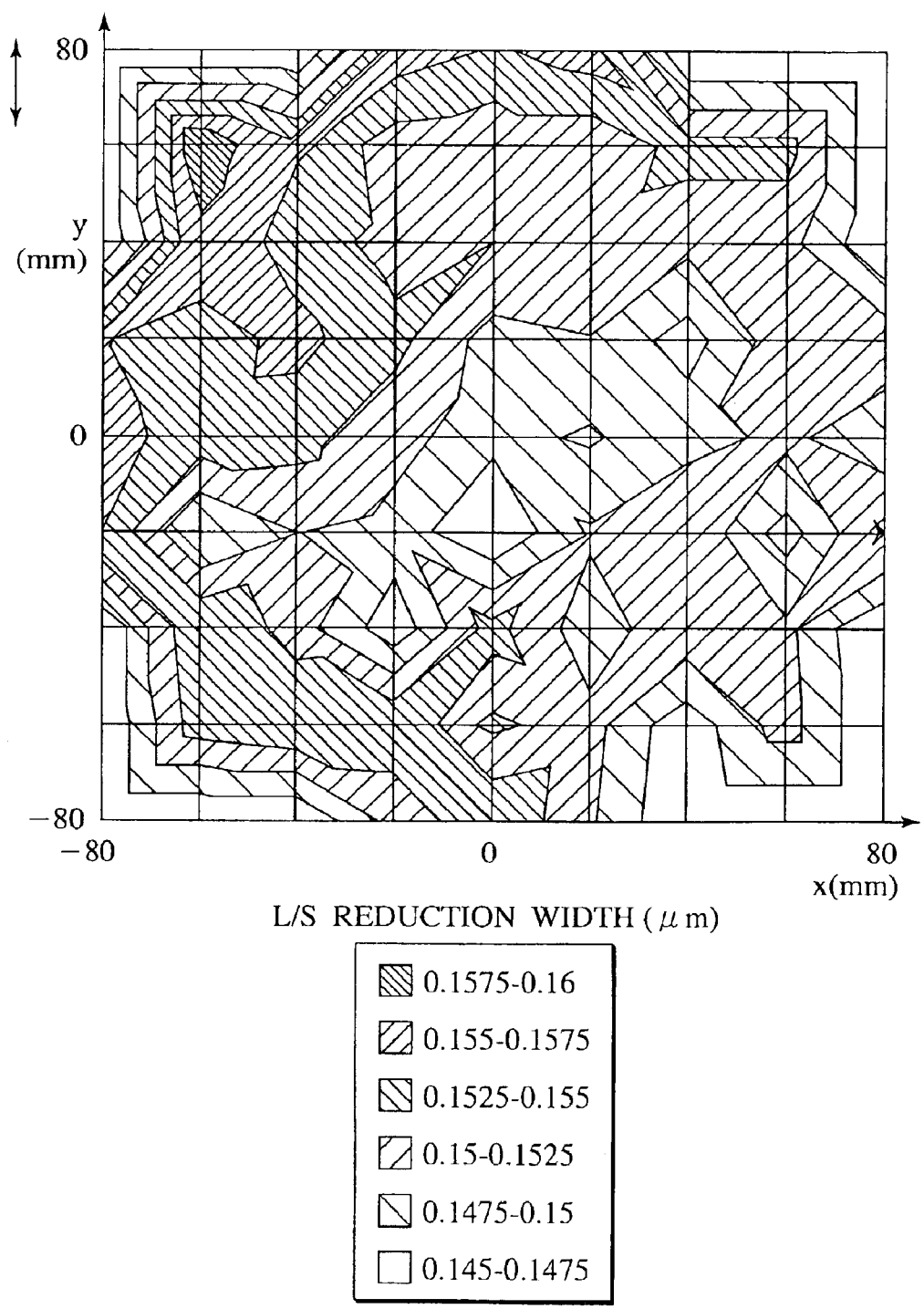
FIG. 28 is a graph showing an example of a distribution of reduction widths of a line/space resist pattern for explaining the exposure method according to the second embodiment of the present invention.
Figure 29:
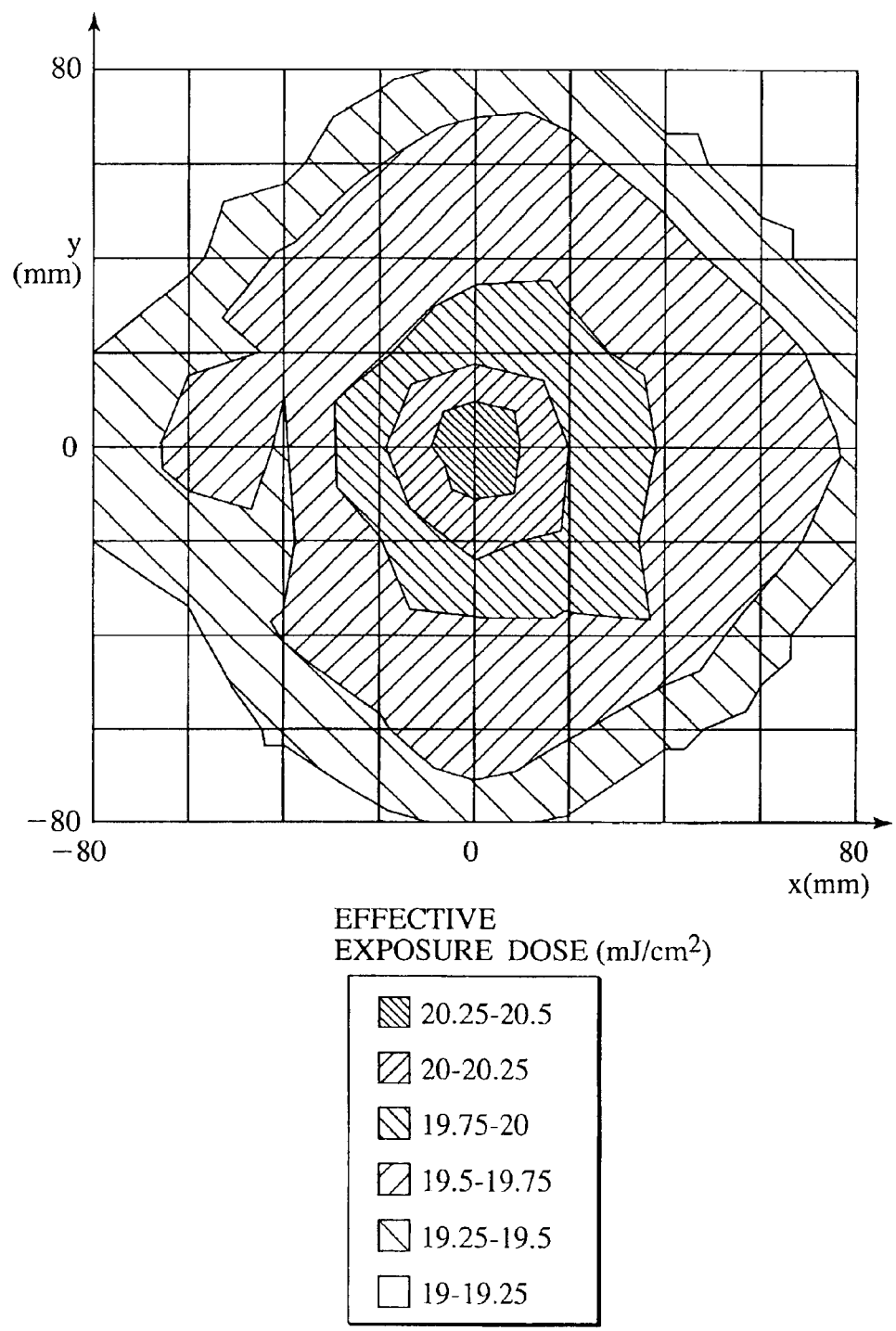
FIG. 29 is a graph showing an example of a distribution of an effective exposure dose for explaining the exposure method according to the second embodiment of the present invention.

Next, a resist film coated on the semiconductor substrate 1 is exposed to each of the exposure field positions S (x, y) shown in FIG. 14, by a uniform exposure dose DB using the reticle 4d. After development, another relative shift width RL (x, y) of the monitor resist pattern 13 is measured and is converted into the effective exposure dose ED (x, y) by use of the equation (2). FIG. 28 shows a distribution of reduction widths of the resist lines 23 of the L/S resist pattern corresponding to the L/S pattern 18 by use of the uniform exposure dose, measured by the SEM. The distribution of the reduction widths of the resist lines 23 shows a variation of 9 nm or more at 3σ where σ is a standard deviation. Meanwhile, FIG. 29 shows an effective exposure dose distribution converted from the relative shift width RL of the monitor resist pattern 13 corresponding to the exposure monitor pattern 16. In FIG. 28, a configuration of the reduction width distribution cannot be clearly seen. On the contrary, in the effective exposure dose distribution shown in FIG. 29, a tendency close to a symmetrical circle distribution can be clearly seen.

To the effective exposure dose data of FIG. 29, the configuration of the effective exposure dose distribution is approximated by use of a second-order polynomial equation shown below.

$$F(x, y) = a*x^2 + b*y^2 + c*x*y + d*x + e*y + f \quad (3)$$

Here, (x, y) is a coordinate showing the position of the semiconductor substrate 1 as shown in FIG. 14, FIG. 28 or FIG. 29, and a, b, c, d, e and f are correction coefficients determined by the measured effective exposure dose and the positional coordinate (x, y). The correction coefficients of quadratic approximate equation F (x, y) are obtained by fitting of the least-squares method. In the third embodiment, the correction coefficients have the following values with reference to FIG. 29; a: $2.67 \times 10^{-11}$, b: $2.89 \times 10^{-11}$, c: $3.41 \times 10^{-12}$, d: $6.53 \times 10^{-8}$, e: $-3.3 \times 10^{-7}$, and f: 19.57. Here, though the effective exposure dose distribution is approximated by use of the second-order polynomial equation, a similar correction is possible as long as the equation is a polynomial equation of n-th order where n is two or more.

Next, by use of the obtained approximate expression, a correction exposure dose is provided as follows.

$$SH(x, y) = 2*DB - F(x, y) \quad (4)$$

Here, SH denotes the correction exposure dose at each exposure field position S (x, y), and DB denotes the uniform exposure dose. The equation (4) determines the correction by adding an over-and-under amount (DB−F (x, y)) of the calculated effective exposure dose to the uniform exposure DB.

Figure 30:
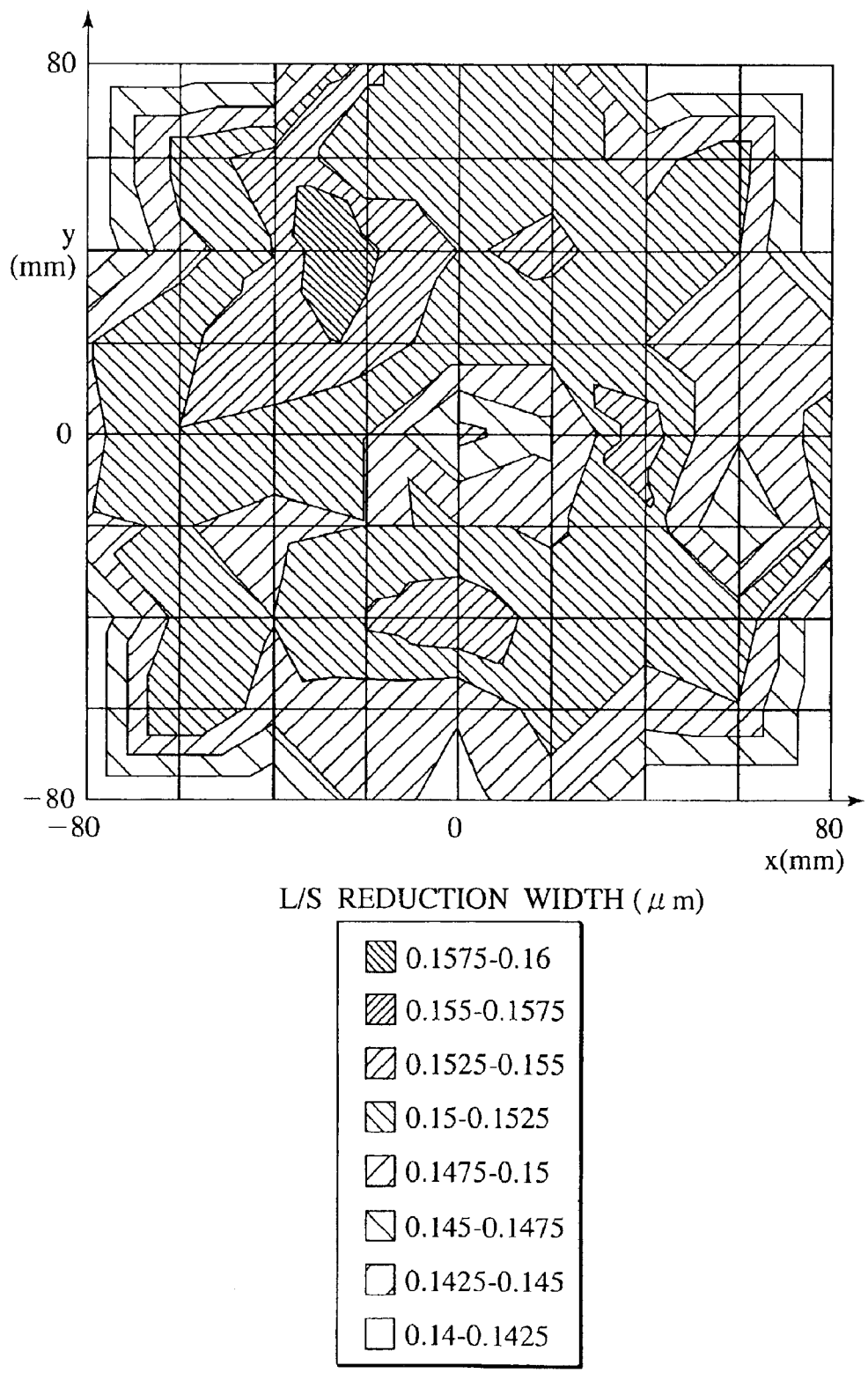
FIG. 30 is a graph showing an example of a distribution of reduction widths of a line/space resist pattern obtained by the exposure method according to the second embodiment of the present invention.
Figure 31:
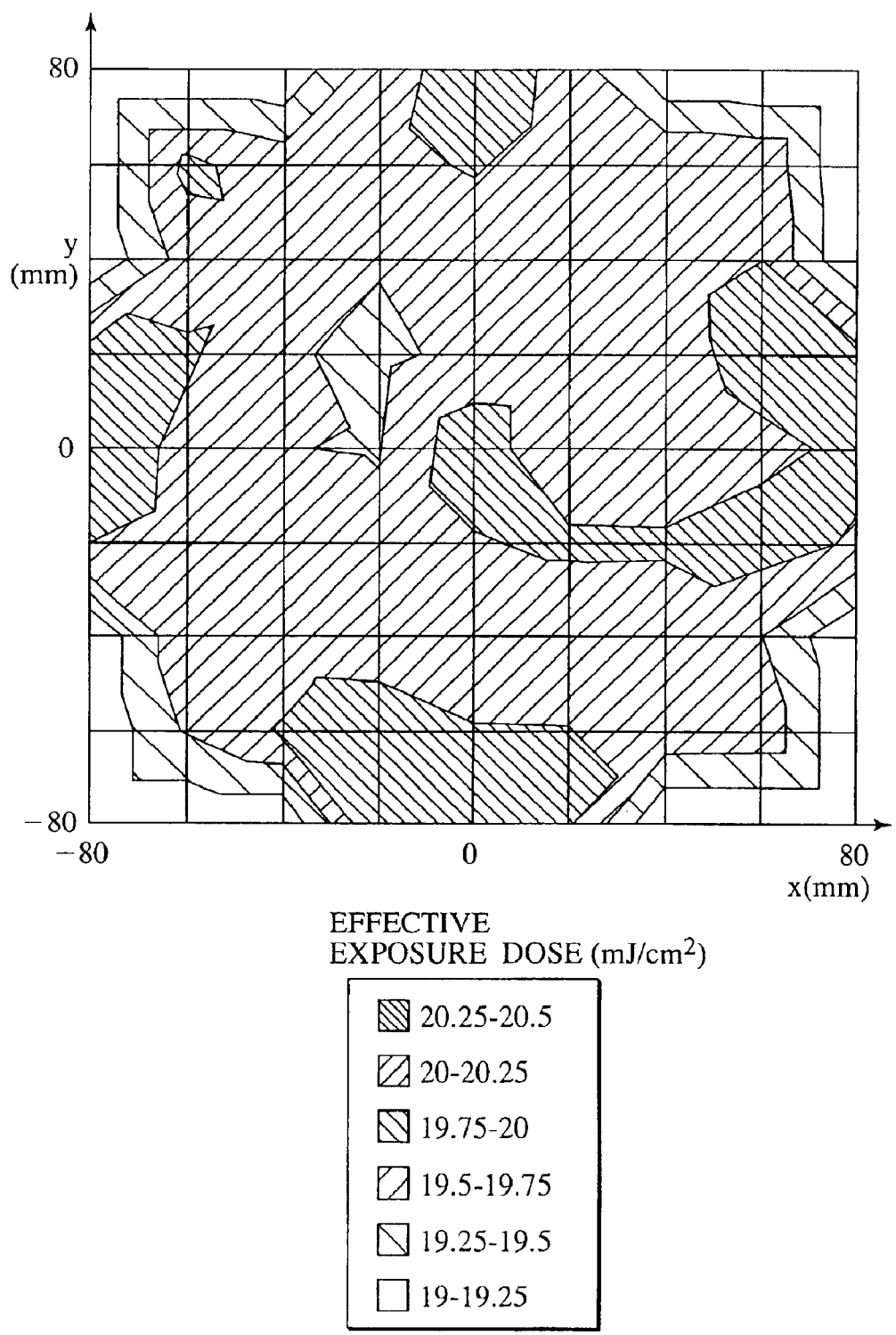
FIG. 31 is a graph showing an example of a distribution of an effective exposure dose obtained by the exposure method according to the second embodiment of the present invention.

Results obtained by performing photolithography by use of the correction exposure dose SH (x, y) in the equation (4) are shown in FIGS. 30 and 31. FIG. 30 is a view of a reduction width distribution of the resist lines 23 of the L/S resist pattern measured by the SEM. The distribution of the reduction widths in the semiconductor substrate 1 is reduced to 6 nm or less at 3σ. FIG. 31 is a view obtained by converting the result of the relative shift width RL of the monitor resist pattern 13 into the effective exposure dose distribution by use of the equation (2). It is clear, as compared to FIG. 29, that the effective exposure dose shows a more even distribution. Moreover, it is understood that the correction by use of the simple second-order polynomial equation shown in the equation (3) has a sufficient effect.

Moreover, the shift width Δs of the monitor underlying film pattern 12 formed by dry etching in the process shown in FIG. 11 is recalculated as a relative shift width BL from the arbitrary reference value set in the overlay inspection system 70. Thus, the relationship between the effective exposure dose ED and the relative shift width BL may be similar for the case of the monitor resist pattern 13. An equation for providing the effective exposure dose ED from the relative shift width BL of the monitor underlying film pattern 12 is similarly expressed as below.

$$ED = -34.4*BL + 31.8 \quad (5)$$

By use of the equation (5), the correction exposure dose can be obtained by the above-described method.

In the exposure method according to the third embodiment of the present invention, dimensional control of the semiconductor device can be easily performed with high accuracy.

Figure 32:
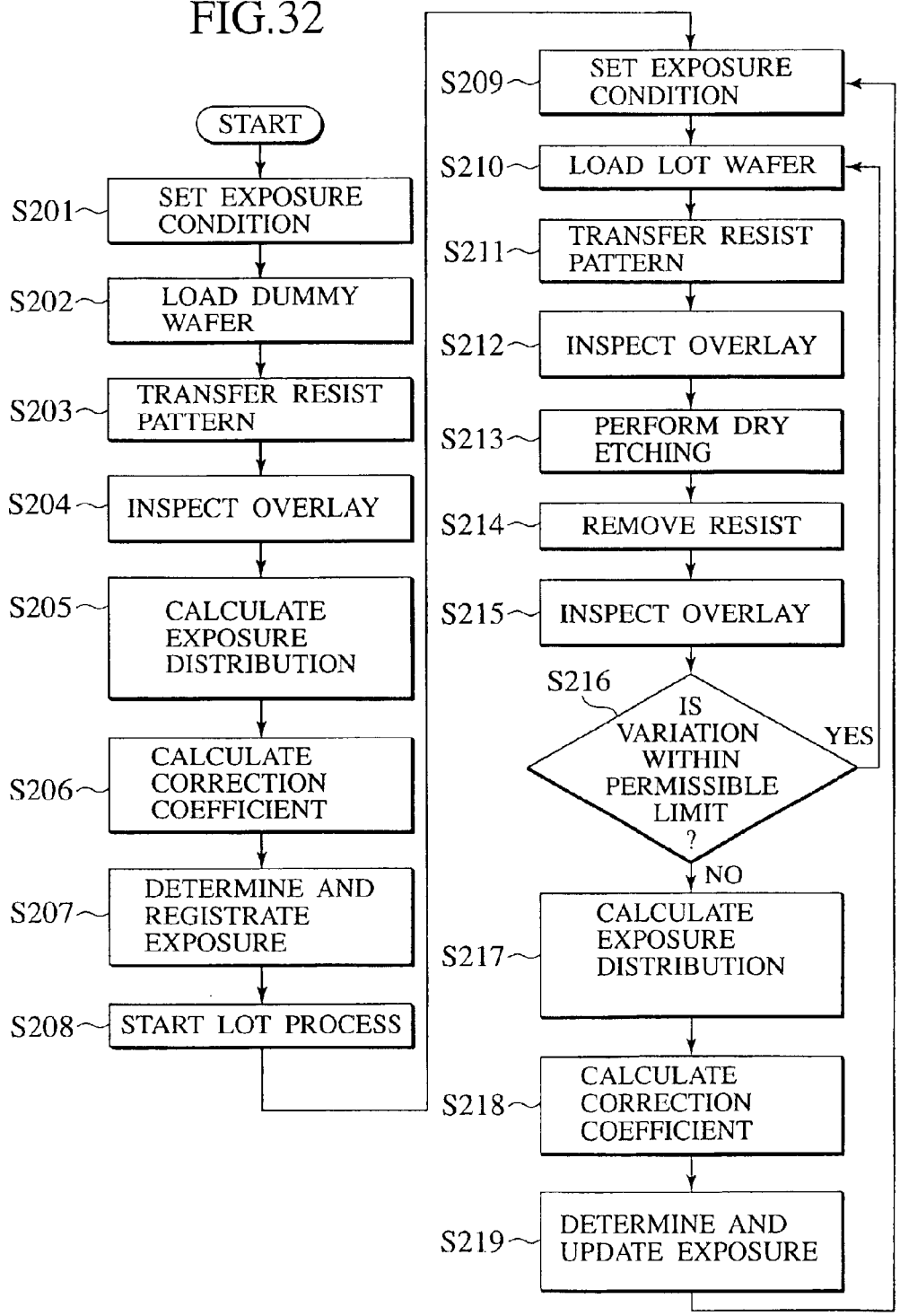
FIG. 32 is a flowchart showing an example of the steps for explaining the exposure method according to the second embodiment of the present invention.

Next, with reference to FIG. 32, an example will be shown, in which the exposure method according to the third embodiment of the present invention is applied to a semiconductor device manufacturing process.

(a) First, in Step S201, the data output module 65 sets an exposure condition so as to apply a uniform exposure dose in each exposure field.

(b) In Step S202, a dummy wafer (a semiconductor substrate) having a resist film applied thereto by spin coating is loaded in the aligner 50.

(c) In Step S203, exposure and development processes are performed by use of the reticle 4d, thus resist patterns are transferred. Here, because of the uniform exposure condition, the aligner control unit 51 performs exposure for each exposure field using the same exposure dose.

(d) In Step S204, a distribution of a relative shift width RL (x, y) of the monitor resist pattern 13 is measured by the overlay inspection system 70 and a result thereof is provided to the data input module 62 of the exposure processing unit 60 by the overlay inspection control module 71.

(e) In Step S205, the exposure calculation module 63 calculates an effective exposure dose ED(x, y) from the relative shift width RL(x, y) and obtains a distribution of the effective exposure dose ED(x, y) in the dummy wafer. A result of the calculation is stored in the memory module 66 together with the data of the relative shift width RL(x, y).

(f) In Step S206, based on the distribution of the effective exposure dose ED(x, y), the correction coefficient calculation module 64 calculates correction coefficients from a quadratic approximate equation F (x, y) by use of the equation (3).

(g) In Step S207, the correction coefficient calculation module 64 determines the correction exposure dose SH (x, y) at each exposure field position by use of the equation (4) and registers the calculated correction exposure dose in the memory module 66 together with the quadratic approximate equation F (x, y).

(h) In Step S208, a production lot processing of a semiconductor device is started.

(i) In Step S209, the data output module 65 sets and outputs the correction exposure dose SH (x, y) to the aligner control unit 51.

(j) In Step S210, a lot wafer (semiconductor substrate 1) to which the semiconductor manufacturing processes is to be applied is loaded in the aligner 50.

(k) In Step S211, the lot wafer is exposed in accordance with the correction exposure dose SH (x, y) at each exposure field position using the reticle 4d. After development, resist patterns are transferred on the lot wafer.

(l) In Step S212, a distribution of a relative shift width RL (x, y) of a monitor resist pattern 13 on the lot wafer is measured by the overlay inspection system 70, and the result thereof is stored in the memory module 66 of the exposure processing unit 60 by the overlay inspection control module 71.

(m) In Step S213, the lot wafer is loaded in the dry etching apparatus 80, and an underlying film deposited on the lot wafer is etched by using the resist patterns as a mask for a dry etching condition set by the dry etching apparatus control module 81.

(n) In Step S214, the resist patterns are removed by use of a resist stripper.

(o) In Step S215, the lot wafer is set in the overlay inspection system 70, and a distribution of a relative shift width BL (x, y) of a monitor underlying film pattern 12 is measured. The result thereof is stored in the memory module 66 of the exposure processing unit 60 by the overlay inspection control module 71.

(p) In Step S216, the exposure calculation module 63 reads out the distribution of the relative shift width BL (x, y) of the monitor underlying film pattern 12 from the memory module 66, and calculates a variation at 3σ of the distribution of the relative shift width BL (x, y). Then, the exposure calculation module 63 compares the calculated variation to a permissible limit of variation. When the variation at 3σ is below the permissible limit, the manufacturing process returns to Step S210 and the processing of the lot wafer is repeated.

(q) When the 3σ value of the distribution of the relative shift width BL (x, y) is larger than the permissible limit for the 3σ value, in Step S217, the exposure calculation module 63 calculates the effective exposure dose ED(x, y) from the relative shift width BL (x, y) by use of the equation (5). The calculated distribution of the effective exposure dose ED (x, y) for the lot wafer is then registered in the memory module 66.

(r) In Step S218, the correction coefficient calculation module 64 obtains another quadratic approximate expression F (x, y) from the effective exposure dose ED(x, y) and updates the quadratic approximate expression F (x, y) in the memory module 66.

(s) In Step S219, the correction coefficient calculation module 64 reads out the present correction exposure dose SH (x, y) and renames the present correction exposure dose SH (x, y) to another relative shift width DB (x, y). By use of the other quadratic approximate expression F (x, y) and the other relative shift width DB (x, y), the correction exposure dose SH (x, y) is re-calculated by the equation (6) and updated in the memory module 66. Then, the processing returns to Step S209 and the lot process is restarted.

By use of the aligner control system according to the third embodiment of the present invention, a manufacturing method for a semiconductor device, which uses an exposure method improving accuracy and uniformity of microfabrication, can be provided.

Note that the correction exposure dose is calculated based not only on the inspection result after the exposure process but also the inspection result of the exposure monitor pattern after the dry etching process. Thus, the correction exposure dose can be controlled even more accurately.

(Modified Example of the Third Embodiment)

In the aligner control system according to the third embodiment of the present invention, the exposure processing unit 60 is assumed to be provided by an exposure processing apparatus such as an individual computer and the like. In a modified example of the third embodiment of the present invention, functions of the exposure processing unit 60 are included in the aligner control unit attached to the aligner. Other points besides the above are similar to the third embodiment, thus repetitive description thereof will be omitted.

Figure 33:
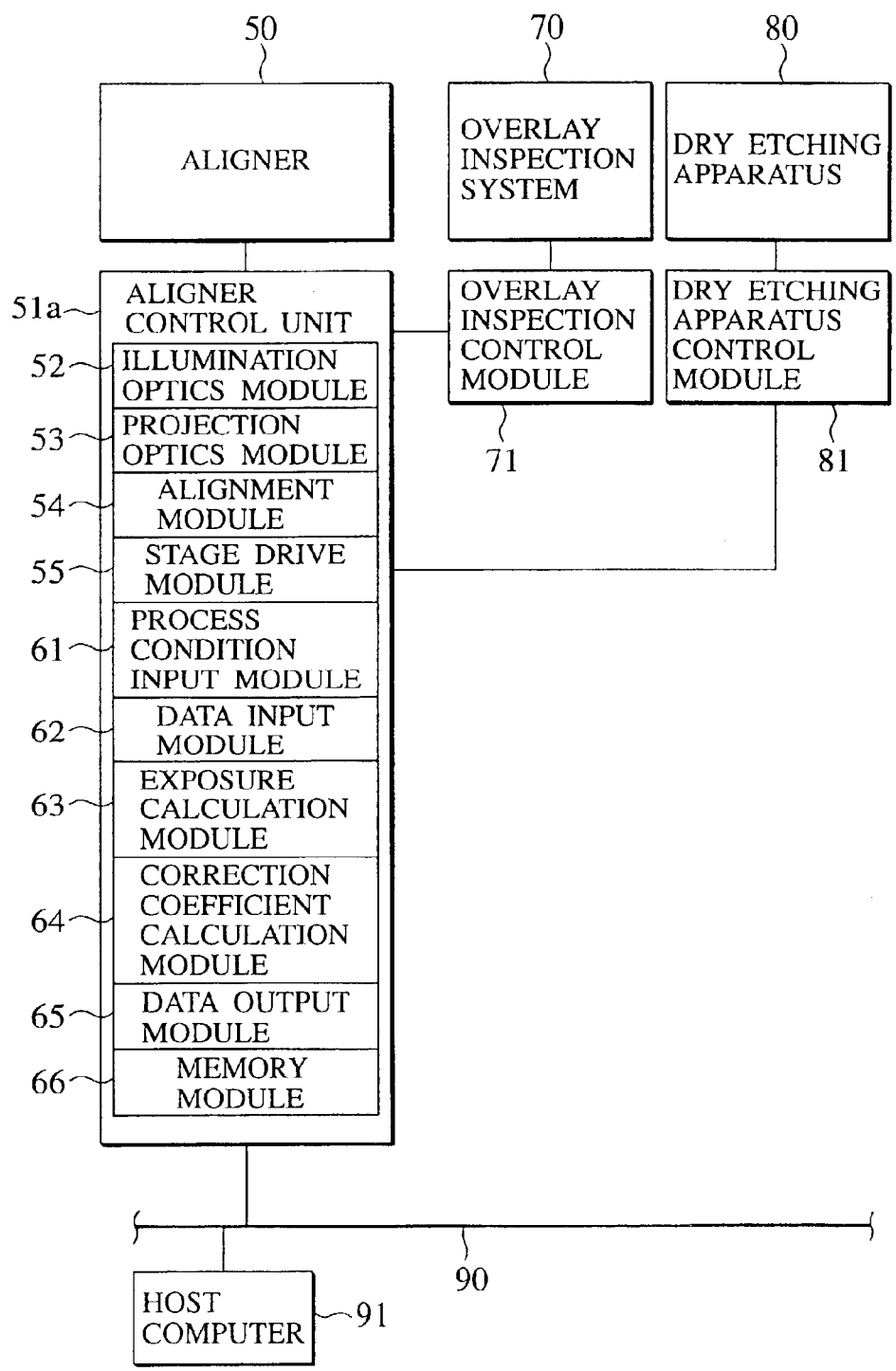
FIG. 33 is a schematic constitutional view of a modified example of an aligner control system used in the exposure method according to the second embodiment of the present invention.

As shown in FIG. 33, the aligner 50 according to the modified example of the third embodiment is the stepper shown in FIG. 2. An aligner control unit 51a includes: the illumination optics module 52; the projection optics module 53; the alignment module 54; the stage drive module 55; the process condition input module 61; the data input module 62; the exposure calculation module 63; the correction coefficient calculation module 64; the data output module 65; and the memory module 66. The exposure processing unit 51a is connected to the LAN 90 and controlled by the host computer 91.

According to the modified example of the third embodiment of the present invention, a manufacturing method for a semiconductor device, which uses an exposure method improving accuracy and uniformity of microfabrication, can be provided.

In a manufacturing method for a semiconductor device according to the modified example of the third embodiment of the present invention, line width monitoring and process control are performed by obtaining a difference of shift widths between patterns formed in a photolithography process and a dry etching process, respectively, by use of the exposure monitor pattern. Other points besides the above are similar as in the first to third embodiments, thus repetitive description thereof will be omitted.

As described above, in the first to third embodiments of the present invention, the process of transferring the pattern of the semiconductor device is controlled by correcting the exposure dose. The corrected exposure dose includes a correction component for variation of the dry etching. However, when the dry etching significantly deviates from an optimal condition and results in a large distribution in pattern widths and the like, the control thereof becomes difficult when using only the correction of the exposure dose. Thus, the variation of the pattern widths increases. When the dry etching condition evidently deviates from the optimal condition and thus a large distribution is generated, the process of transferring the pattern of the semiconductor device can be more efficiently controlled by readjusting the dry etching condition. In the manufacturing method of a semiconductor device according to the modified example of the third embodiment of the present invention, an influence on the pattern width in the dry etching process is monitored and extracted by using a technique similar to the correction of the exposure dose, and an optimal condition for the dry etching is adjusted.

Figure 34:
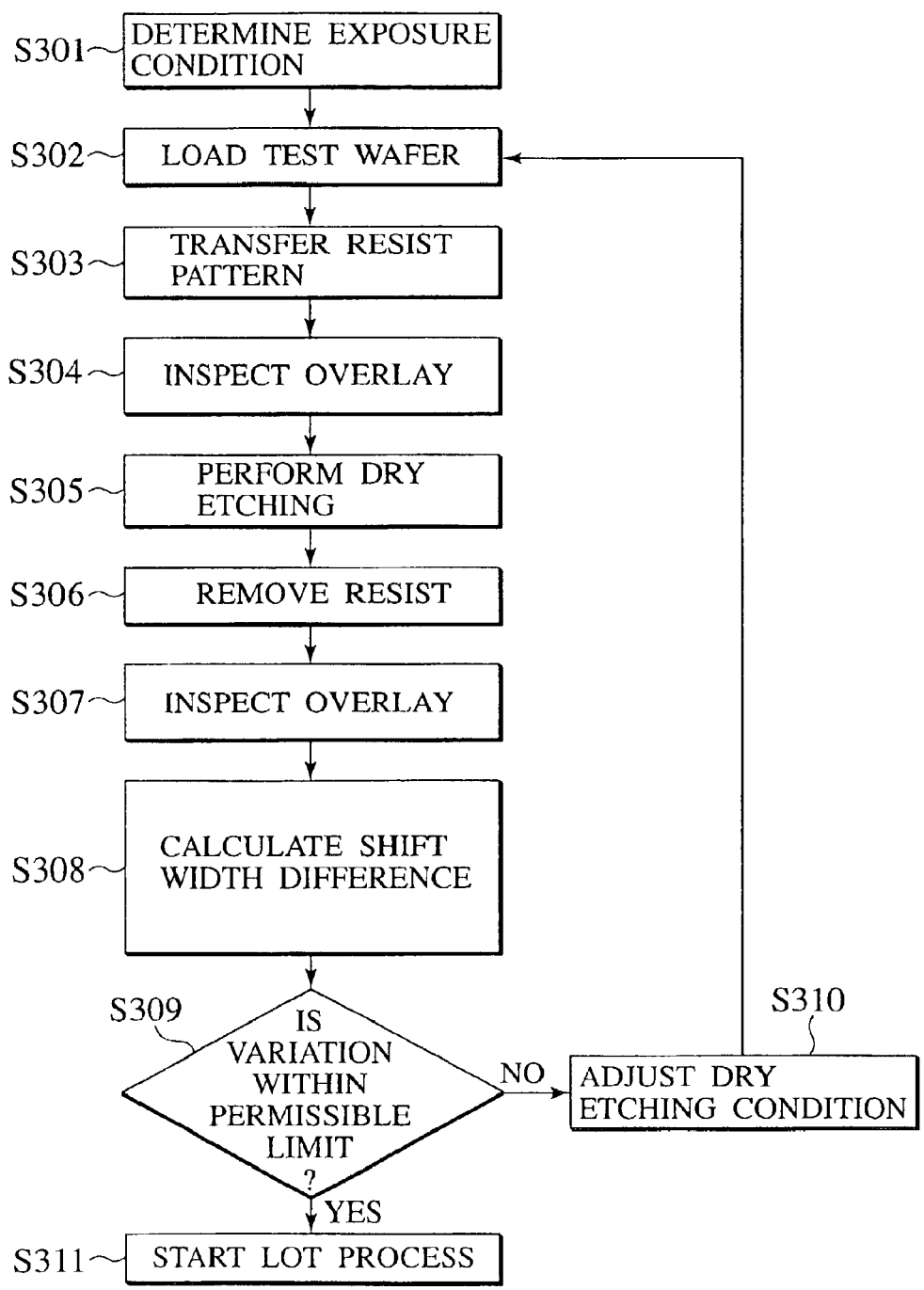
FIG. 34 is a flowchart showing an example of the steps for explaining a dry etching control method according to an application of the second embodiment of the present invention.

A manufacturing method for a semiconductor device according to the modified example of the third embodiment of the present invention is described using the flowchart shown in FIG. 34.

(a) In Step S301, the data output module 65 reads out the previously stored correction exposure dose SH (x, y) from the memory module 66 and outputs the correction exposure dose SH (x, y) to the aligner control unit 51.

(b) In Step S302, a test wafer (semiconductor substrate) to which the semiconductor manufacturing processes is to be applied is loaded in the aligner 50 for an etching test.

(c) In Step S303, the test wafer is exposed in accordance with the correction exposure dose SH (x, y) at each exposure field position using the reticle 4d. After development, resist patterns are transferred on the test wafer.

(d) In Step S304, a distribution of a relative shift width RL (x, y) of a monitor resist pattern 13 on the test wafer is measured by the overlay inspection system 70, and the result thereof is stored in the memory module 66 of the exposure processing unit 60 by the overlay inspection control module 71.

(e) In Step S305, the test wafer is loaded in the dry etching apparatus 80, and an underlying film deposited on the test wafer is etched by using the resist patterns as a mask for a dry etching condition set by the dry etching apparatus control module 81.

(f) In Step S306, the resist patterns are removed by use of a resist stripper.

(g) In Step S307, the test wafer is set in the overlay inspection system 70, and a distribution of a relative shift width BL (x, y) of a monitor underlying film pattern 12 is measured. The result thereof is stored in the memory module 66 of the exposure processing unit 60 by the overlay inspection control module 71.

(h) In Step S308, from the memory module 66, the exposure calculation module 63 reads the relative shift width RL (x, y) of the monitor resist pattern 13 and the relative shift width BL (x, y) of the monitor underlying film pattern 12 and calculates a shift width difference between the relative shift widths RL (x, y) and BL (x, y).

(i) In Step S309, the exposure calculation module 63 calculates a variation at $3\sigma$ of the shift width difference distribution and compares a variation of the shift width difference distribution to a permissible limit for variation.

(j) When the variation at $3\sigma$ of the shift width difference distribution exceeds the permissible limit, in Step S310, the dry etching condition is adjusted. Then, the processing returns to Step S302 and the etching test is repeated.

(k) When the variation at $3\sigma$ of the shift width difference distribution is below the permissible limit, then in Step S311, the manufacturing process of a lot wafer (semiconductor substrate 1) is started.

In the modified example of the third embodiment of the present invention, the monitor underlying film pattern 12 is formed by the dry etching process using the monitor resist pattern 13, which is projected and transferred from the exposure monitor pattern, as a mask. From the relative shift width RL of the monitor resist pattern 13 after the photolithography and the relative shift width BL of the monitor underlying film pattern 12 after the dry etching, the shift width difference distribution is calculated. Therefore, the shift width difference distribution corresponds to a surface distribution of the dry etching. It is needless to say that a processing similar to that mentioned above may be performed by using an effective exposure dose converted from the relative shift width.

Figure 35:
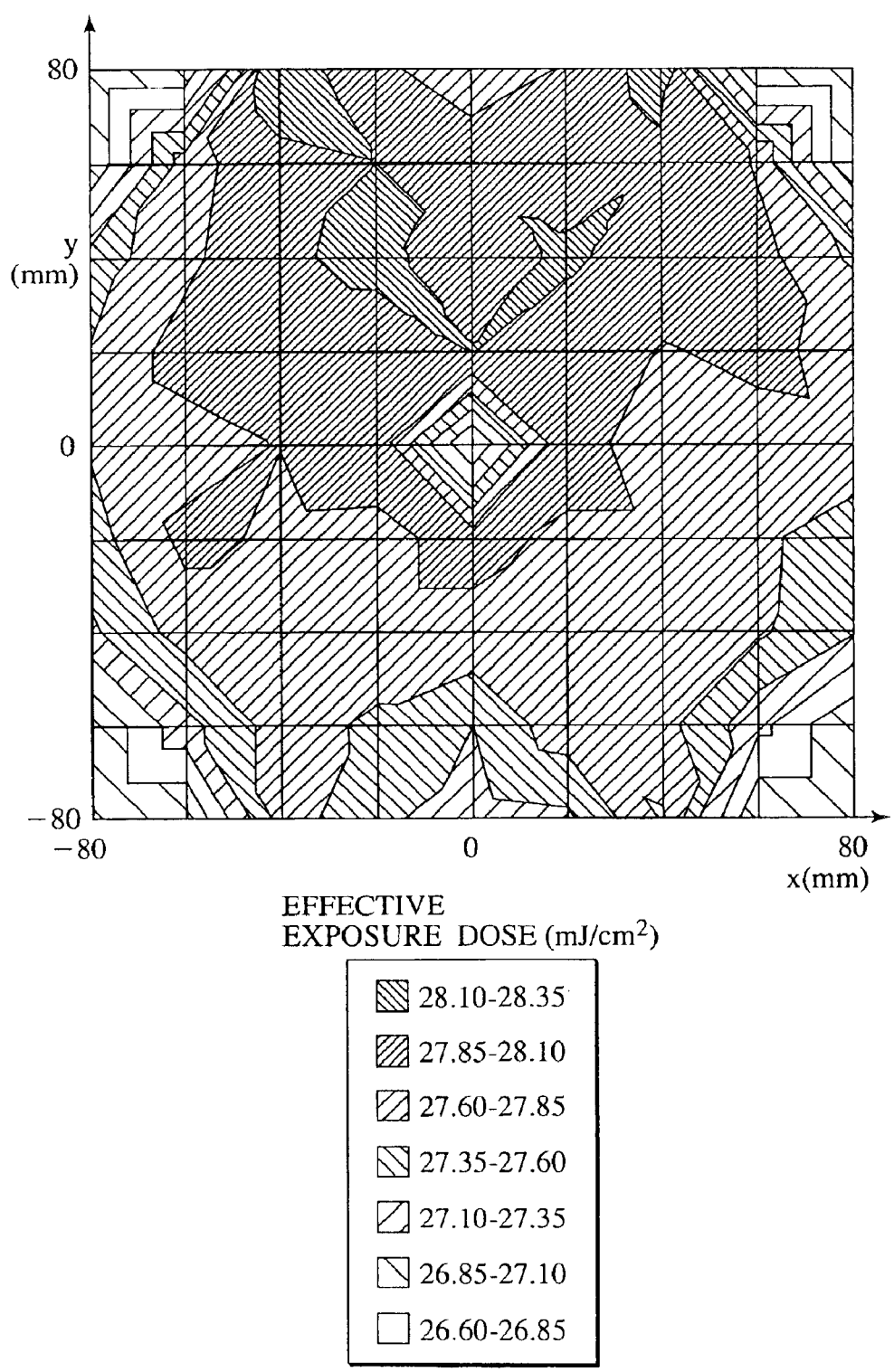
FIG. 35 is a graph showing an example of a distribution of an effective exposure dose regarding to a resist pattern obtained by the dry etching control method according to the application of the second embodiment of the present invention.
Figure 36:
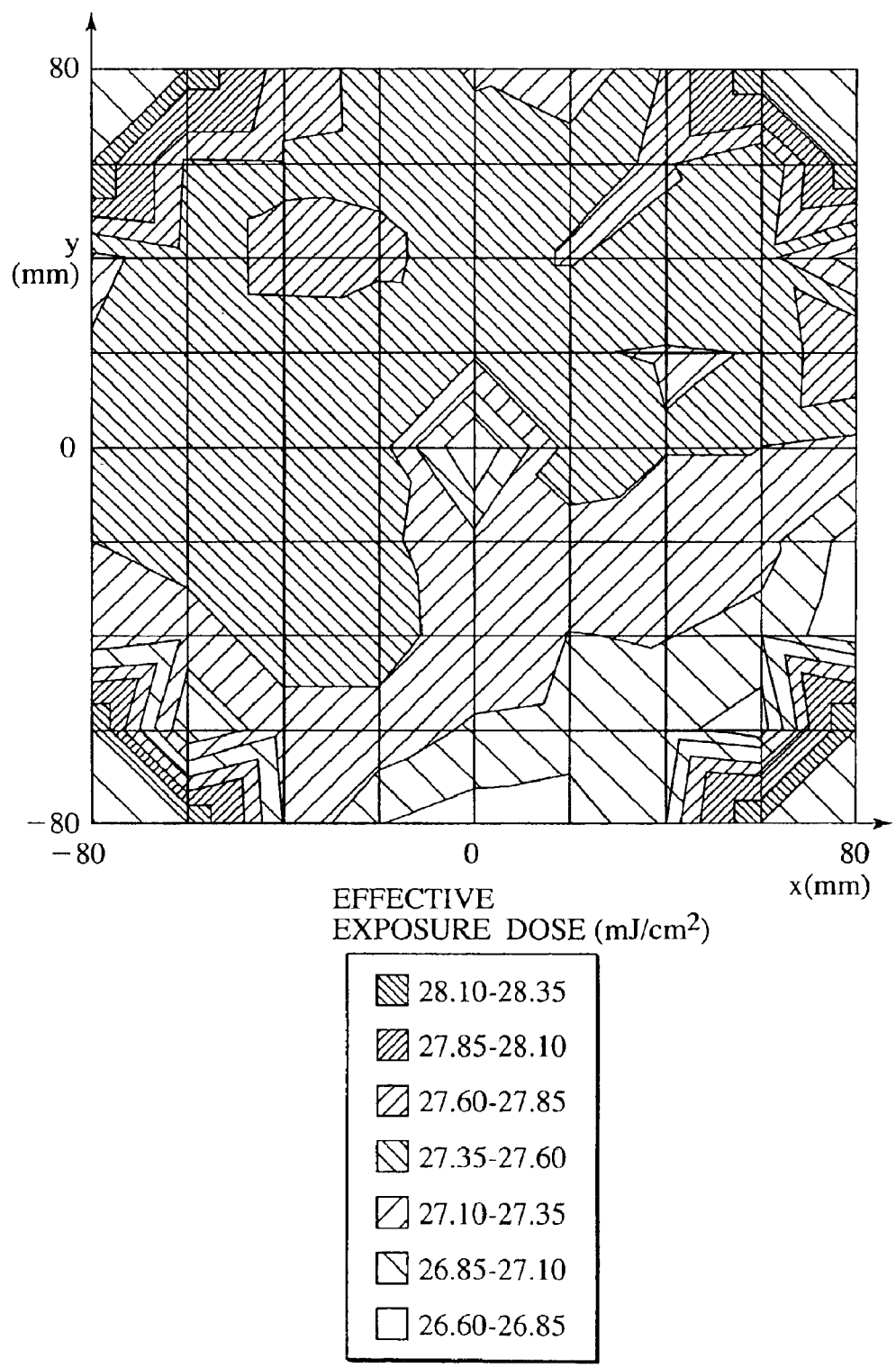
FIG. 36 is a graph showing an example of a distribution of an effective exposure dose regarding to a foundation silicon oxide film pattern obtained by the dry etching control method according to the application of the second embodiment of the present invention.
Figure 37:
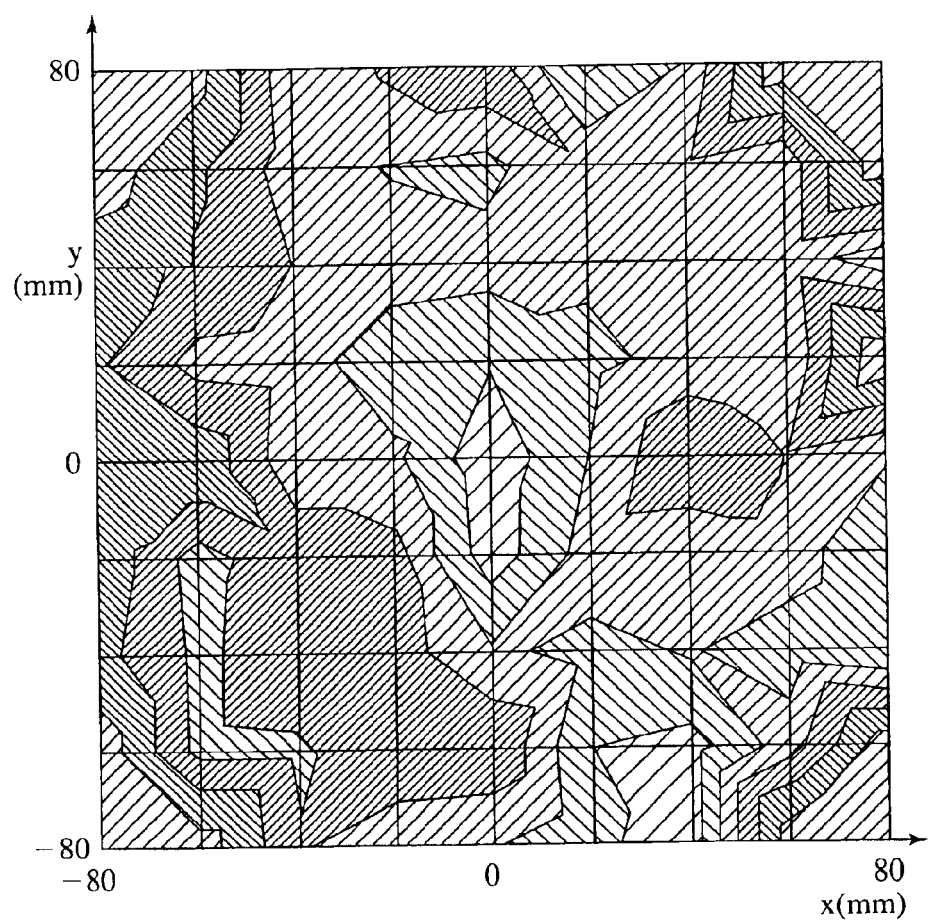
FIG. 37 is a graph showing an example of a distribution of an effective exposure dose difference obtained by the dry etching control method according to the application of the second embodiment of the present invention.

FIGS. 35 and 36 show effective exposure dose distributions calculated respectively, from the relative shift widths of the monitor resist pattern 13 and the monitor underlying film pattern 12, which are provided in Steps S304 and S307. FIG. 37 shows an effective exposure dose difference distribution obtained by subtracting one of the effective exposure distributions from the other. In such a manner, according to the modified example of the third embodiment of the present invention, a dimensional variation induced by the dry etching can be observed as the effective exposure dose distribution.

Moreover, it is apparent from the above description that the influence of the dry etching can be similarly measured also by use of the exposure monitor pattern of the second embodiment of the present invention.

According to the modified example of the third embodiment of the present invention, an etching method using a monitoring method improving accuracy and uniformity of microfabrication can be provided.

Other Embodiments

As described above, the present invention has been described according to the first to third embodiments. However, it should be understood that the description and drawings constituting a part of this disclosure are not limitations to the invention. Various alternative embodiments, embodiments and operation techniques will become apparent to those skilled in the art from this disclosure.

In the first to third embodiments of the present invention, as a matter of explanatory convenience, the KrF excimer laser reduction projection aligner is used. However, it is needless to say that, also as the light source, ultraviolet lights such as I-line, g-line and the like, other excimer lasers, electron beams, X rays or the like may be used. Moreover, an aligner of a contact type, a proximity type, a mirror projection type or the like may be used.

Moreover, as a plasma source of the RIE used as the anisotropic dry etching, a parallel plate type is well known. However, it is needless to say that, depending on a frequency band of an electromagnetic wave, an introduction method of the electromagnetic wave, and an applying method of the electromagnetic wave and a magnetic field, all of which are used in etching, the plasma source of various types, for example, an magneto-microwave type represented by an electron cyclotron resonance (ECR), a magnetron type, a helicon wave type, a surface wave type and the like can be used for the dry etching. Furthermore, besides the RIE, anisotropic dry etching methods such as reactive ion beam etching (RIBE), ion beam etching (IBE) and the like are applicable.

In the first to third embodiments of the present invention, in order to provide a distribution of transmissivity of the exposure light, an exposure pattern is used in which the opening ratios of the diffraction grating are varied at a desired rate. However, without being limited to the diffraction grating, any methods may be used as long as the distribution of the transmissivity of the exposure light can be provided by use of the other method. For example, a thin metal film has a light transmission property. Thus, when a metal film used as an opaque film for a reticle, is deposited while being allowed to have a thickness distribution, the transmissivity of light can be varied. Alternatively, when particles of an opaque material are distributed with a slanting density, the transmissivity can be varied.

Moreover, the description was made by use of the $SiO_2$ film as the underlying film. However, it is clear that other insulating films can be used, including, for example, a silicon nitride film ($Si_3N_4$), a silicon oxynitride film ($SiO_xN_y$), a phospho silicate glass (PSG) film or a borophospho silicate glass (BPSG) film, a spin-on glass film (SOG), a polyimide film, a fluorinated silicon oxide film, an organopolysiloxane compound film, an inorganic polysiloxane compound film, and the like. Furthermore, without being limited to the insulating film, a conductive film, for example, a metal film such as aluminum (Al), copper (Cu) and the like, a refractory metal film represented by titanium (Ti) and tungsten (W) and a refractory metal silicide film, a polysilicon film or the like can be used as the underlying film processed by the anisotropic dry etching.

What is claimed is:

1. A monitoring method, comprising:
    delineating a monitor resist pattern on an underlying film, the monitor resist pattern having a tilted sidewall slanted to a surface of the underlying film at least at one edge of the monitor resist pattern;
    measuring a width of the monitor resist pattern in an orthogonal direction to a cross line of the tilted sidewall intersecting with the underlying film;
    delineating a monitor underlying film pattern by selectively etching the underlying film using the monitor resist pattern as a mask;
    measuring a width of the monitor underlying film pattern in the orthogonal direction; and
    obtaining a shift width in the monitor underlying film pattern from a difference between the width of the monitor resist pattern and the width of the monitor underlying film pattern.

2. The monitoring method of claim 1, wherein the monitor resist pattern is formed by exposure from a diffraction grating pattern having a pitch, a light transmissivity varies stepwise at a constant increment along a direction perpendicular to a direction of parallel lines implementing the diffraction grating pattern.

3. The monitoring method of claim 1, wherein the pitch of the diffraction grating is smaller than a width calculated by a relational expression using a light source wavelength, a lens numerical aperture and a coherence factor of an aligner performing the exposure.

4. The monitoring method of claim 1, wherein the pitch P of the diffraction grating satisfies a condition of $P<\lambda/NA*(1+\sigma)$, wherein the light source wavelength is $\lambda$, the lens numerical aperture is NA and the coherence factor is $\sigma$.

5. An exposure method, comprising:
    assigning a plurality of exposure fields on a surface of a semiconductor substrate; and
    setting exposure doses for the exposure fields by approximation using an exposure dose function defined on positional coordinates of the semiconductor substrate.

6. The exposure method of claim 5, wherein the exposure dose function is calculated from a shift width distribution obtained by exposure to the exposure fields, delineating a pattern and measuring a shift width of the pattern for each of the exposure fields, the exposure dose function is a polynomial equation of the second order or greater than the second order of the positional coordinates.

7. The exposure method of claim 5, wherein the pattern is a monitor resist pattern having a tilted sidewall slanted to a surface of the semiconductor substrate at least at one edge of the monitor resist pattern.

8. The exposure method of claim 6, wherein an angle of a sidewall opposing the tilted sidewall of the monitor resist pattern to the surface of the semiconductor substrate is approximately a right angle.

9. The exposure method of claim 7, wherein the monitor resist pattern is formed by exposure from a diffraction grating pattern having a pitch, a light transmissivity varies stepwise at a constant increment along a direction perpendicular to a direction of parallel lines implementing the diffraction grating pattern.

10. The exposure method of claim 7, wherein the pitch of the diffraction grating is smaller than a width calculated by a relational expression using a light source wavelength, a lens numerical aperture and a coherence factor of an aligner performing the exposure.

11. The exposure method of claim 7, wherein the pitch P of the diffraction grating satisfies a condition of $P<\lambda/NA*(1+\sigma)$, wherein the light source wavelength is $\lambda$, the lens numerical aperture is NA and the coherence factor is $\sigma$.

12. The exposure method of claim 6, wherein the pattern is a monitor underlying film pattern formed by selective etching by using the monitor resist pattern as a mask.

13. A manufacturing method of a semiconductor device, comprising:
    performing a manufacturing process for fabricating the semiconductor device on a semiconductor substrate;
    setting exposure doses for a plurality of exposure fields by approximation using an exposure dose function of positional coordinates defined on the semiconductor substrate for each of the exposure fields, the plurality of exposure fields are assigned on a surface of the semiconductor substrate;
    depositing an underlying film on the semiconductor substrate;
    delineating a monitor resist pattern having a tilted sidewall slanted to a surface of the underlying film;
    delineating a monitor underlying film pattern by selectively etching the underlying film using the monitor resist pattern as a mask;
    measuring a shift width distribution of shift widths of the monitor underlying film pattern each of the exposure fields;
    comparing a variation in the shift width distribution to a permissible limit value; and when the variation is smaller than the permissible limit value, performing a second manufacturing process while maintaining the exposure doses of the exposure fields, and when the variation exceeds the permissible limit value, performing the second manufacturing process by approximating the shift width distribution by use of a polynomial equation of positional coordinates defined on the semiconductor substrate and calculating another exposure doses for the exposure fields.

14. The manufacturing method of claim 13, wherein the exposure dose function is a polynomial equation of the second order or greater than the second order of the positional coordinates.

15. The manufacturing method of claim 13, wherein an angle of a sidewall opposing the tilted sidewall of the monitor resist pattern to surface of the underlying film is approximately a right angle.

16. The manufacturing method of claim 13, wherein the monitor resist pattern is formed by exposure from a diffraction grating pattern having a pitch, a light transmissivity varies stepwise at a constant increment along a direction perpendicular to a direction of parallel lines implementing the diffraction grating pattern.

17. The manufacturing method of claim 13, wherein the pitch of the diffraction grating is smaller than a width calculated by a relational expression using a light source wavelength, a lens numerical aperture and a coherence factor of an aligner performing the exposure.

18. The manufacturing method of claim 13, wherein the pitch P of the diffraction grating satisfies a condition of $P<\lambda/NA^*(1+\sigma)$, wherein the light source wavelength is $\lambda$, the lens numerical aperture is NA and the coherence factor is $\sigma$.

19. An etching method, comprising:
setting exposure doses for a plurality of exposure fields assigned on a surface of an underlying layer, the underlying film deposited on a semiconductor substrate;
delineating a monitor resist pattern having a tilted sidewall slanted to a surface of the underlying film;
measuring a shift width of the monitor resist pattern for each of the exposure fields;
delineating a monitor underlying film pattern by selectively etching the underlying film by an etching condition using the monitor resist pattern as a mask;
measuring a shift width of the monitor underlying film pattern for each of the exposure fields;
obtaining a shift width difference distribution by taking a difference between the shift width of the monitor underlying film pattern and the shift width of the monitor resist pattern;
comparing a variation in the shift width difference distribution to a permissible limit value; and
when the variation is smaller than the permissible limit value, maintaining the etching condition, and when the variation exceeds the permissible limit value, setting another etching condition repeating a processing to compare another variation in another shift width difference distribution to the permissible limit value by adjusting the etching condition.

20. The etching method of claim 19, wherein an angle of a sidewall opposing the tilted sidewall of the monitor resist pattern to surface of the underlying film is approximately a right angle.

21. The etching method of claim 19, wherein the monitor resist pattern is formed by exposure from a diffraction grating pattern having a pitch, a light transmissivity varies stepwise at a constant increment along a direction perpendicular to a direction of parallel lines implementing the diffraction grating pattern.

22. The etching method of claim 19, wherein the pitch of the diffraction grating is smaller than a width calculated by a relational expression using a light source wavelength, a lens numerical aperture and a coherence factor of an aligner performing the exposure.

23. The etching method of claim 19, wherein the pitch P of the diffraction grating satisfies a condition of $P<\lambda/NA^*(1+\sigma)$, wherein the light source wavelength is $\lambda$, the lens numerical aperture is NA and the coherence factor is $\sigma$.

24. A manufacturing method of a semiconductor device, comprising:
performing a manufacturing process for fabricating the semiconductor device on a semiconductor substrate;
setting exposure doses for a plurality of exposure fields assigned on a surface of the semiconductor substrate;
depositing an underlying film on the semiconductor substrate;
coating a resist film on the underlying film;
delineating a monitor resist pattern having a tilted sidewall slanted to a surface of the underlying film;
measuring a shift width of the monitor resist pattern for each of the exposure fields;
delineating a monitor underlying film pattern by selectively etching the underlying film by an etching condition using the monitor resist pattern as a mask;
measuring a shift width of the monitor underlying film pattern for each of the exposure fields;
obtaining a shift width difference distribution by taking a difference between the shift width of the monitor underlying film pattern and the shift width of the monitor resist pattern;
comparing a variation in the shift width difference distribution to a permissible limit value; and
when the variation is smaller than the permissible limit value, performing a second manufacturing process by maintaining the etching condition, and when the variation exceeds the permissible limit value, performing the second manufacturing process by setting another etching condition repeating a processing to compare another variation in another shift width difference distribution to the permissible limit value by adjusting the etching condition.

25. The manufacturing method of claim 24, wherein an angle of a sidewall opposing the tilted sidewall of the monitor resist pattern to surface of the underlying film is approximately a right angle.

26. The manufacturing method of claim 24, wherein the monitor resist pattern is formed by exposure from a diffraction grating pattern having a pitch, a light transmissivity varies stepwise at a constant increment along a direction perpendicular to a direction of parallel lines implementing the diffraction grating pattern.

27. The manufacturing method of claim 24, wherein the pitch of the diffraction grating is smaller than a width calculated by a relational expression using a light source wavelength, a lens numerical aperture and a coherence factor of an aligner performing the exposure.

28. The manufacturing method of claim 24, wherein the pitch P of the diffraction grating satisfies a condition of $P<\lambda/NA^*(1+\sigma)$, wherein the light source wavelength is $\lambda$, the lens numerical aperture is NA and the coherence factor is $\sigma$.

29. An exposure processing unit, comprising:

a data input module configured to acquire shift widths of patterns for each of a plurality of exposure fields assigned on a surface of a semiconductor substrate, the patterns being delineated on the semiconductor substrate by use of an aligner performing a sequential exposure to the exposure fields;

an exposure calculation module configured to convert the shift widths into effective exposure doses by use of a relational expression;

a correction coefficient calculation module configured to calculate correction coefficients by an approximation of a distribution of the effective exposure doses for each of the exposure fields by use of an exposure dose function of positional coordinates defined on the semiconductor substrate; and a data output module configured to output corrected exposure doses being corrected by the correction coefficients of the exposure fields to an aligner control unit.

30. The exposure processing unit of claim 29, wherein the exposure dose function is a polynomial equation of the second order or greater than the second order of positional coordinates.

31. The exposure processing unit of claim 29, wherein the pattern is a monitor resist pattern having a tilted sidewall slanted to a surface of the semiconductor substrate at least at one edge of the monitor resist pattern.

32. The exposure processing unit of claim 29, wherein an angle of a sidewall opposing the tilted sidewall of the monitor resist pattern to surface of the underlying film is approximately a right angle.

33. The exposure processing unit of claim 29, wherein the monitor resist pattern is formed by exposure from a diffraction grating pattern having a pitch, a light transmissivity varies stepwise at a constant increment along a direction perpendicular to a direction of parallel lines implementing the diffraction grating pattern.

34. The exposure processing unit of claim 29, wherein the pitch of the diffraction grating is smaller than a width calculated by a relational expression using a light source wavelength, a lens numerical aperture and a coherence factor of an aligner performing the exposure.

35. The exposure processing unit of claim 29, wherein the pitch P of the diffraction grating satisfies a condition of $P<\lambda/NA*(1+\sigma)$, wherein the light source wavelength is $\lambda$, the lens numerical aperture is NA and the coherence factor is $\sigma$.

36. The exposure processing unit of claim 29, wherein the pattern is a monitor underlying film pattern formed by selective etching using the monitor resist pattern as a mask.

* * * * *

UNITED STATES PATENT AND TRADEMARK OFFICE
CERTIFICATE OF CORRECTION

PATENT NO. : 6,866,976 B2
DATED : March 15, 2005
INVENTOR(S) : Asano et al.

It is certified that error appears in the above-identified patent and that said Letters Patent is hereby corrected as shown below:

Title page,
Item [74], Inventors, change "Finngan," to -- Finnegan, --.

Column 24,
Line 64, change "pattern each" to -- pattern for each --.

Signed and Sealed this

Fourteenth Day of June, 2005

JON W. DUDAS
*Director of the United States Patent and Trademark Office*